(12) United States Patent
Chen et al.

(10) Patent No.: US 12,453,147 B2
(45) Date of Patent: Oct. 21, 2025

(54) SEMICONDUCTOR STRUCTURE AND METHOD OF FABRICATING THE SEMICONDUCTOR STRUCTURE

(71) Applicant: TAIWAN SEMICONDUCTOR MANUFACTURING COMPANY LTD., Hsinchu (TW)

(72) Inventors: Guan-Lin Chen, Hsinchu (TW); Kuo-Cheng Chiang, Hsinchu County (TW); Chih-Hao Wang, Hsinchu County (TW); Shi Ning Ju, Hsinchu (TW); Jui-Chien Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/585,098

(22) Filed: Feb. 23, 2024

(65) Prior Publication Data

US 2024/0194735 A1    Jun. 13, 2024

Related U.S. Application Data

(60) Division of application No. 17/571,941, filed on Jan. 10, 2022, now Pat. No. 11,942,513, which is a
(Continued)

(51) Int. Cl.
*H10D 62/10* (2025.01)
*H01L 21/02* (2006.01)
(Continued)

(52) U.S. Cl.
CPC ..... *H10D 62/121* (2025.01); *H01L 21/02532* (2013.01); *H01L 21/30604* (2013.01);
(Continued)

(58) Field of Classification Search
CPC .. H10D 62/121; H10D 62/292; H10D 62/151; H10D 62/116; H10D 30/024;
(Continued)

(56) References Cited

U.S. PATENT DOCUMENTS 9,608,116 B2 * 3/2017 Ching .................. H01L 29/775
9,741,811 B2 * 8/2017 Hatcher ............. H10D 30/6735
(Continued)

*Primary Examiner* — Dao H Nguyen
(74) *Attorney, Agent, or Firm* — WPAT LAW; Anthony King

(57) ABSTRACT

The present disclosure provides a semiconductor structure, including a substrate having a front surface, a first semiconductor layer proximal to the front surface, a second semiconductor layer over the first semiconductor layer, a gate having a portion between the first semiconductor layer and the second semiconductor layer, a spacer between the first semiconductor layer and the second semiconductor layer, contacting the gate, and a source/drain (S/D) region, wherein the S/D region is in direct contact with a bottom surface of the second semiconductor layer, and the spacer has an upper surface interfacing with the second semiconductor layer, the upper surface including a first section proximal to the S/D region, a second section proximal to the gate, and a third section between the first section and the second section.

20 Claims, 24 Drawing Sheets

Related U.S. Application Data continuation of application No. 16/785,296, filed on Feb. 7, 2020, now Pat. No. 11,222,948.

(60) Provisional application No. 62/907,213, filed on Sep. 27, 2019.

(51) Int. Cl.
| | | |
|---|---|---|
| *H01L 21/265* | (2006.01) | |
| *H01L 21/306* | (2006.01) | |
| *H01L 21/3105* | (2006.01) | |
| *H01L 21/762* | (2006.01) | |
| *H10D 30/01* | (2025.01) | |
| *H10D 30/62* | (2025.01) | |
| *H10D 30/67* | (2025.01) | |
| *H10D 62/17* | (2025.01) | |
| *H10D 64/01* | (2025.01) | |

(52) U.S. Cl.
CPC .......... *H10D 30/024* (2025.01); *H10D 30/62* (2025.01); *H10D 30/6735* (2025.01); *H10D 62/292* (2025.01); *H10D 64/015* (2025.01); *H10D 64/021* (2025.01); *H01L 21/02271* (2013.01); *H01L 21/26513* (2013.01); *H01L 21/31053* (2013.01); *H01L 21/76224* (2013.01); *H10D 64/017* (2025.01)

(58) Field of Classification Search
CPC .... H10D 30/62; H10D 30/6735; H10D 30/43; H10D 30/014; H10D 30/6757; H10D 64/015; H10D 64/021; H10D 64/017; H01L 21/02532; H01L 21/30604; H01L 21/02271; H01L 21/26513; H01L 21/76224
See application file for complete search history.

(56) References Cited

U.S. PATENT DOCUMENTS

| | | | |
|---|---|---|---|
| 10,535,733 B2* | 1/2020 | Cheng | H10D 30/6757 |
| 11,222,948 B2* | 1/2022 | Chen | H10D 30/024 |
| 2019/0058052 A1* | 2/2019 | Frougier | H10D 62/292 |
| 2019/0157444 A1* | 5/2019 | Yang | H01L 29/0653 |
| 2019/0181224 A1* | 6/2019 | Zhang | H01L 21/02532 |

* cited by examiner

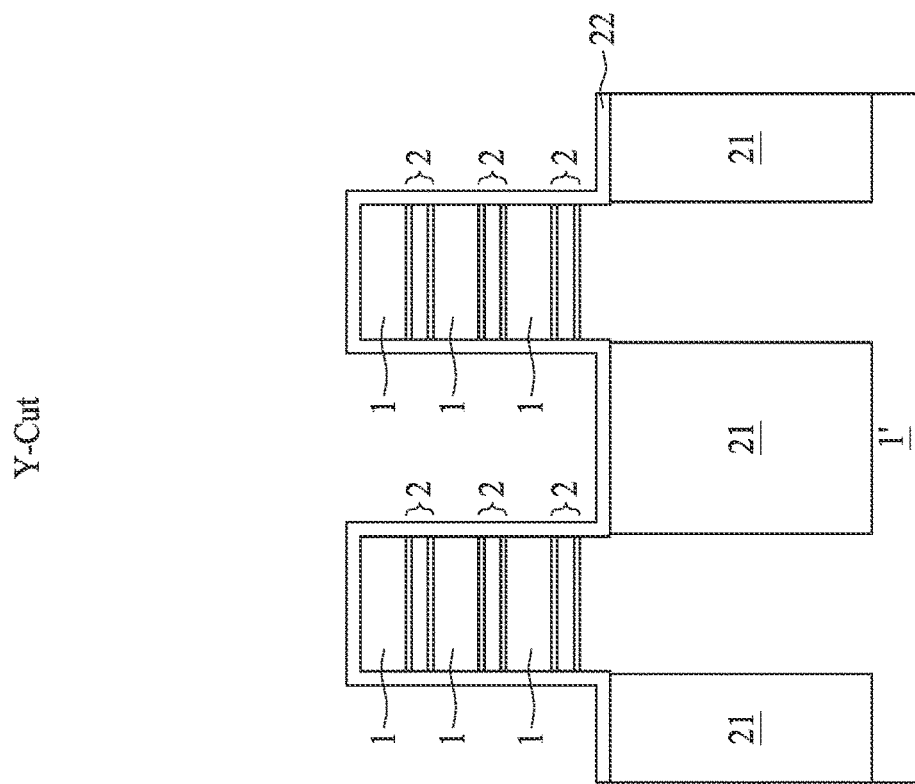
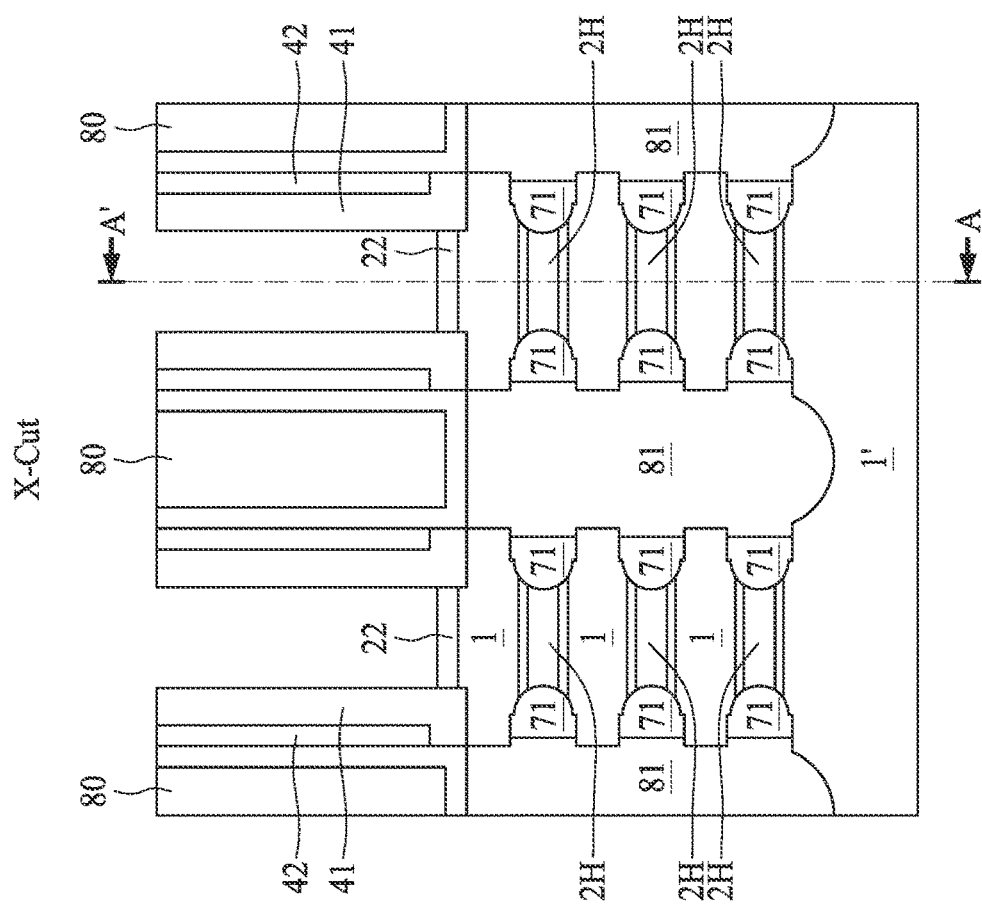
FIG. 16A
FIG. 16B

SEMICONDUCTOR STRUCTURE AND METHOD OF FABRICATING THE SEMICONDUCTOR STRUCTURE

PRIORITY CLAIM

This application claims the benefit of prior-filed provisional application No. 62/907,213, filed Sep. 27, 2019, prior-filed U.S. patent application Ser. No. 16/785,296, filed Feb. 7, 2020, and prior-filed U.S. patent application Ser. No. 17/571,941, filed Jan. 10, 2022, which are incorporated by reference in its entirety.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16A is a cross sectional view of a semiconductor structure during intermediate stages of manufacturing operations, according to some embodiments of the present disclosure.

FIG. 16B is a schematic drawing illustrating a cross sectional view taken along line A-A' of FIG. 16A, according to some embodiments of the present disclosure.

DETAILED DESCRIPTION

Figure 1A:
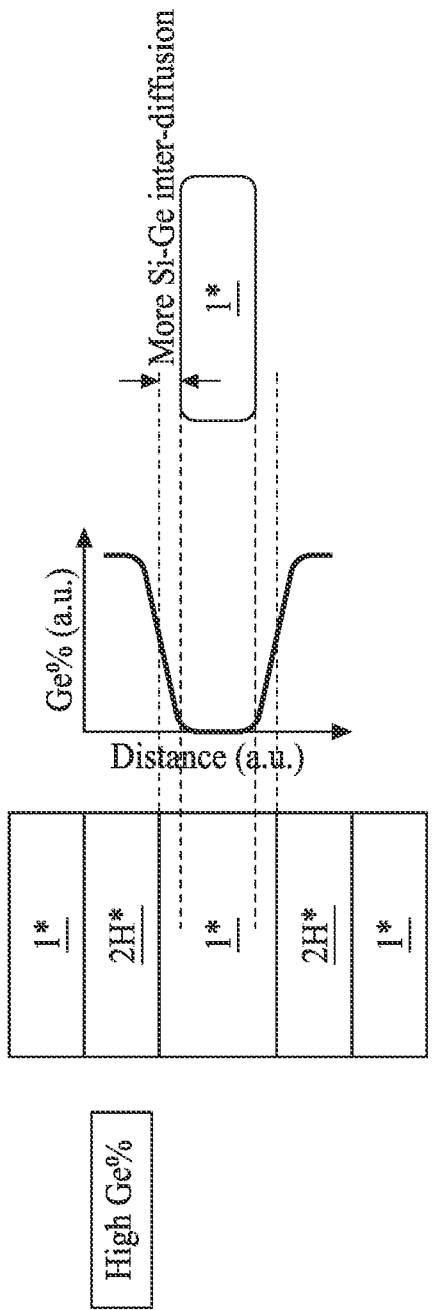
FIG. 1A is a schematic drawing illustrating a cross sectional view of a semiconductor structure, germanium concentration distribution thereof, and an inter-diffusion area of a silicon layer, according to some comparative embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1B:
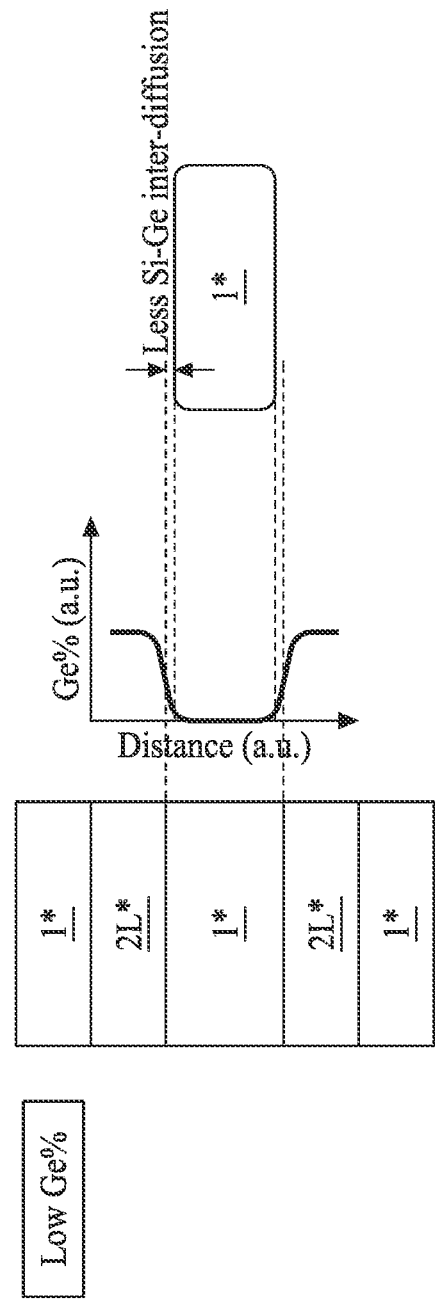
FIG. 1B is a schematic drawing illustrating a cross sectional view of a semiconductor structure, germanium concentration distribution thereof, and an inter-diffusion area of a silicon layer, according to some comparative embodiments.

Referring to FIG. 1A and FIG. 1B, FIG. 1A is a schematic drawing illustrating a cross sectional view of a semiconductor structure, germanium concentration distribution thereof, and an inter-diffusion area of a silicon layer, FIG. 1B is a schematic drawing illustrating a cross sectional view of a semiconductor structure, germanium concentration distribution thereof, and an inter-diffusion area of a silicon layer, according to some comparative embodiments. In fabricating a gate-all-around transistor structure composed of Si and SiGe stacks, germanium concentration in the SiGe layer is pivotal to the etching selectivity between the SiGe layer and Si layer in the stack. In some embodiments, the etching operation imposes a greater etching rate to the silicon germanium layer with higher germanium concentration comparing to the silicon germanium layer with lower germanium concentration.

One of the etching operation to the Si and SiGe stacks is associated with a lateral etch of the SiGe layer in order to form a side recess to accommodate an inner spacer. However, as shown in FIG. 1A, when depositing a SiGe layer 2H* with a high germanium concentration between two adjacent Si layers 1*, Si layer undesirably suffers from greater loss due to high inter-diffusion between Si layer 1* and the SiGe layer 2H* contacts thereto. On the other hand, as shown in FIG. 1B, when depositing a SiGe layer 2L* with a lower germanium concentration between two adjacent Si layers 1*, the SiGe layer 2L* may not be effectively removed during etching operation due to low etching selectivity. In some cases, it is observed that the SiGe layer 2L* is barely etched due to low etching selectivity.

The present disclosure provides a semiconductor structure and a method for forming semiconductor structure. Specifically, in order to effectively remove at least a portion of a SiGe layer between two Si layers (so the entire SiGe layer can be effectively removed in subsequent operations before forming gate material) while alleviating material loss to the Si layer under such etching operation, as will be subsequently discussed in FIG. 2A to FIG. 2B, a SiGe stack 2 is utilized to control the etching rate distribution thereof.

Figure 2A:
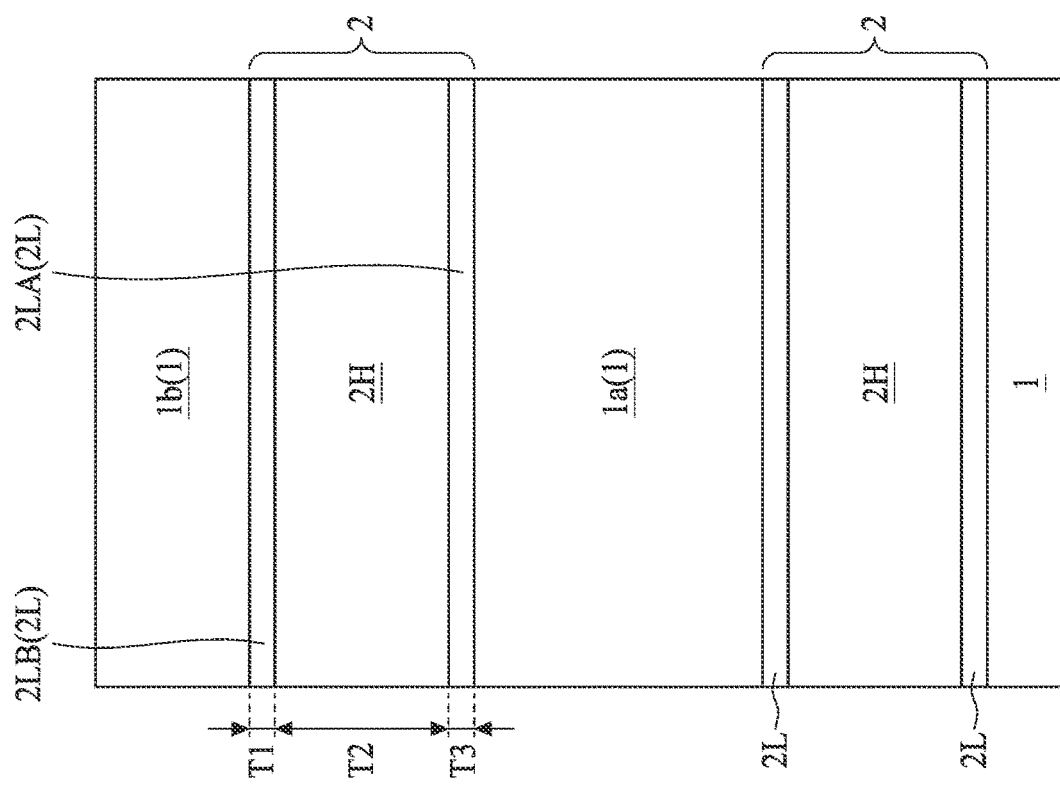
FIG. 2A is a schematic drawing illustrating a cross sectional view of a semiconductor structure, according to some embodiments of the present disclosure.
Figure 2B:
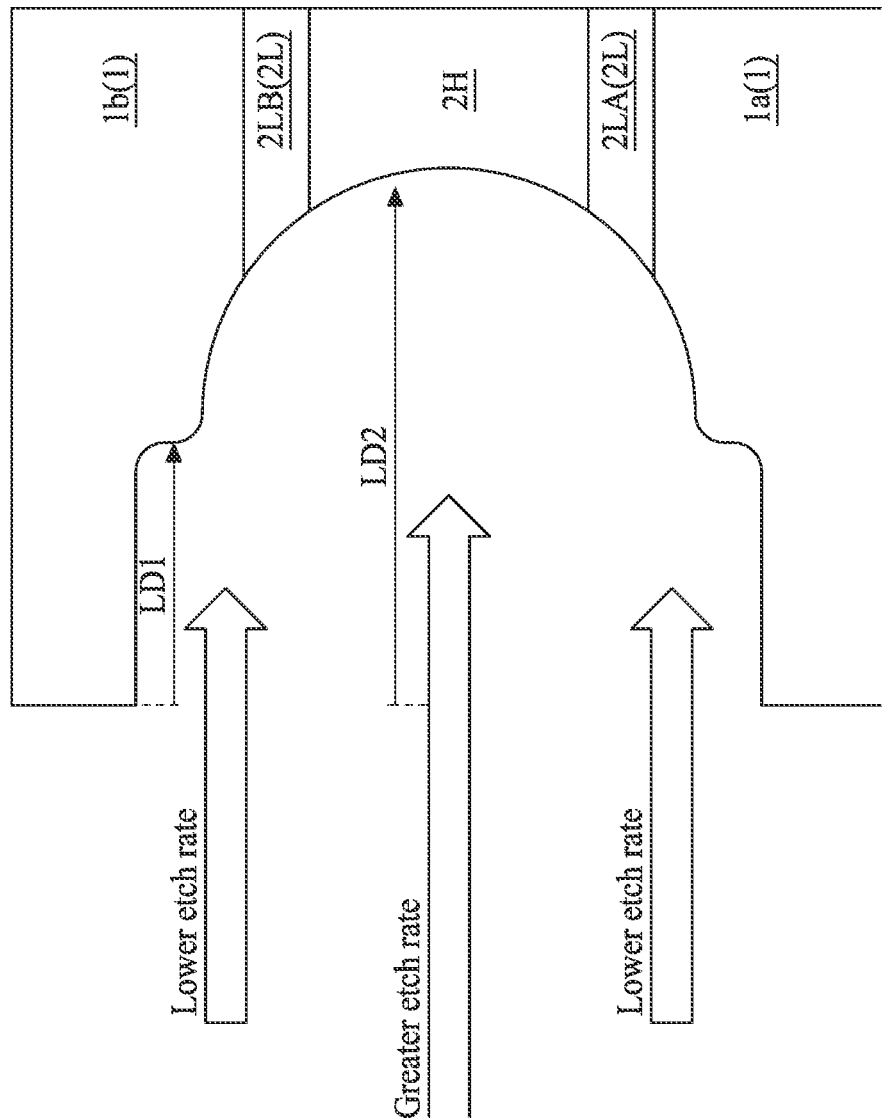
FIG. 2B is a schematic drawing illustrating a cross sectional view of a semiconductor structure, according to some embodiments of the present disclosure.

Referring to FIG. 2A and FIG. 2B, FIG. 2A is a schematic drawing illustrating a cross sectional view of a semiconductor structure, FIG. 2B is a schematic drawing illustrating a cross sectional view of a semiconductor structure, according to some embodiments of the present disclosure. A SiGe stack 2 is disposed between a first silicon layer 1a and a second silicon layer 1b, wherein the SiGe stack 2 includes a silicon germanium layer 2H having a higher germanium concentration, and a silicon germanium layer 2L having a lower germanium concentration. Specifically, the SiGe stack 2 includes a first silicon germanium layer 2LA over the first silicon layer 1a, a second silicon germanium layer 2H over the first silicon germanium layer 2LA, and a third silicon germanium layer 2LB over the second silicon germanium layer 2H, wherein the second silicon layer 1b is above the third silicon germanium layer 2LB. Herein the first silicon germanium layer 2LA has a first germanium concentration, the second silicon germanium layer 2H has a second germanium concentration, and the third silicon germanium layer 2LB has a third germanium concentration, wherein the second germanium concentration is greater than the first germanium concentration, and the third germanium concentration is less than the second germanium concentration. Alternatively stated, the portion having greater germanium concentration among the SiGe stack 2 is proximal to the middle of the SiGe stack 2, and silicon germanium layers 2L having lower germanium concentration proximal to the silicon layers 1. In some embodiments, the first germanium concentration is in a range from about 15% to about 25%. In some embodiments, the second germanium concentration (atomic concentration) is in a range from about 30% to about 45%. In some embodiments, the third germanium concentration is in a range from about 15% to about 25%.

As previously discussed in FIG. 1A and FIG. 1B, germanium concentration in the SiGe layer is pivotal to the etching selectivity between the SiGe layer and Si layer in the stack. In some embodiments, the etching operation imposes a greater etching rate to the silicon germanium layer with higher germanium concentration comparing to the silicon germanium layer with lower germanium concentration. That is, under the etching operation, the etching rate to the second silicon germanium layer 2H is greater than either the first silicon germanium layer 2LA or the third silicon germanium layer 2LB. When laterally removing a portion of the SiGe stack 2, a lateral depth LD2 of removed portion in the second silicon germanium layer 2H is greater than a lateral depth LD1 of removed portion in the first silicon germanium layer 2LA and the third silicon germanium layer 2LB. Thereby, it is relative easier to remove the remaining second silicon germanium layer 2H in subsequent operation (which will subsequently be discussed in FIG. 17A and FIG. 17B), while alleviating the material loss of the silicon layer 1. Furthermore, in order to further facilitate the etching performance, the thickness and/or the germanium concentration of each of the first silicon germanium layer 2LA, the second silicon germanium layer 2H, and the third silicon germanium layer 2LB can be adjusted. In some embodiments, a thickness T2 of the second silicon germanium layer 2H is greater than either a thickness T1 of the first silicon germanium layer 2LA or a thickness T3 of the third silicon germanium layer 2LB. For example, the thickness T2 of the second silicon germanium layer 2H may be in a range from about 2.5 nm to about 6.0 nm, and the thickness T1 of the first silicon germanium layer 2LA and the thickness T3 of the third silicon germanium layer 2LB may be in a range from about 1.0 nm to about 2.0 nm. For another example, a germanium concentration (atomic percentage) of the second silicon germanium layer 2H may be in a range from about 30% to about 45%, a germanium concentration of the first silicon germanium layer 2LA and a germanium concentration (atomic percentage) of the third silicon germanium layer 2LB may be in a range from about 15% to about 25%. It is appreciated, however, that the values recited throughout the description are examples, and may be changed to different values.

The above SiGe stack 2 can be used in the semiconductor fabrication operations as subsequently discussed in FIG. 3A to FIG. 18E. It should be noted that similar fabrication operations may also be applied to semiconductor structures having different materials (e.g. other than Si—SiGe stack), wherein etching rate is found to be related to inter-diffusion between two different materials. For example, a sacrificial layer is disposed between a first semiconductor layer and a second semiconductor layer, wherein the sacrificial layer may include a stack having an etch rate profile under a certain etching operation similar to FIG. 2B.

Figure 3A:
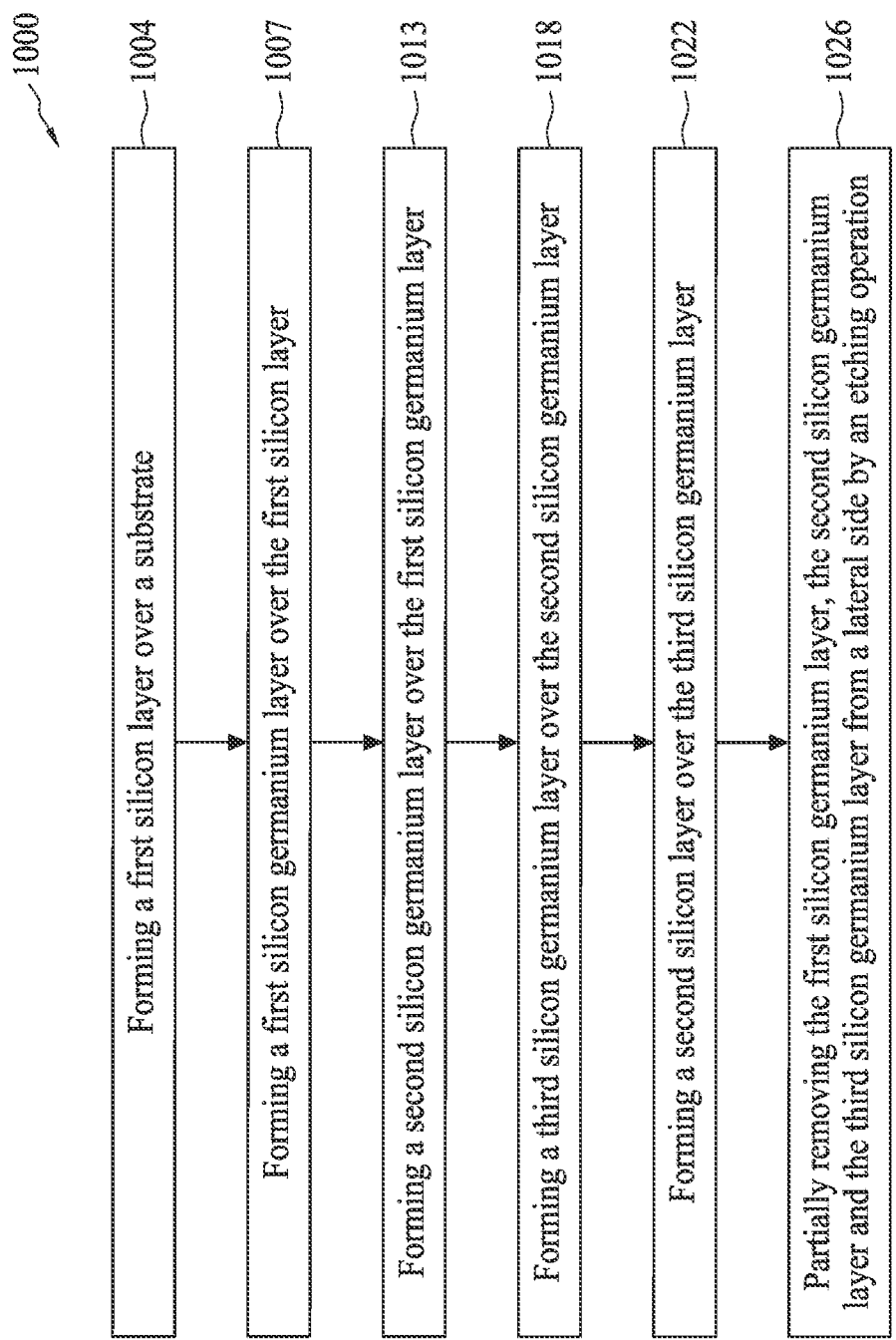
FIG. 3A shows a flow chart representing a method for fabricating a semiconductor structure, in accordance with some embodiments of the present disclosure.

Referring to FIG. 3A, FIG. 3A shows a flow chart representing a method for fabricating a semiconductor structure, in accordance with some embodiments of the present disclosure. The method 1000 for fabricating a semiconductor structure includes forming a first silicon layer over a substrate (operation 1004, which can be referred to FIG. 5), forming a first silicon germanium layer over the first silicon layer (operation 1007, which can be referred to FIG. 5), forming a second silicon germanium layer over the first silicon germanium layer (operation 1013, which can be referred to FIG. 5), forming a third silicon germanium layer over the second silicon germanium layer (operation 1018, which can be referred to FIG. 5), forming a second silicon layer over the third silicon germanium layer (operation 1022, which can be referred to FIG. 5), and partially removing the first silicon germanium layer, the second silicon germanium layer and the third silicon germanium layer from a lateral side by an etching operation (operation 1026, which can be referred to FIG. 11A and FIG. 11B).

Figure 3B:
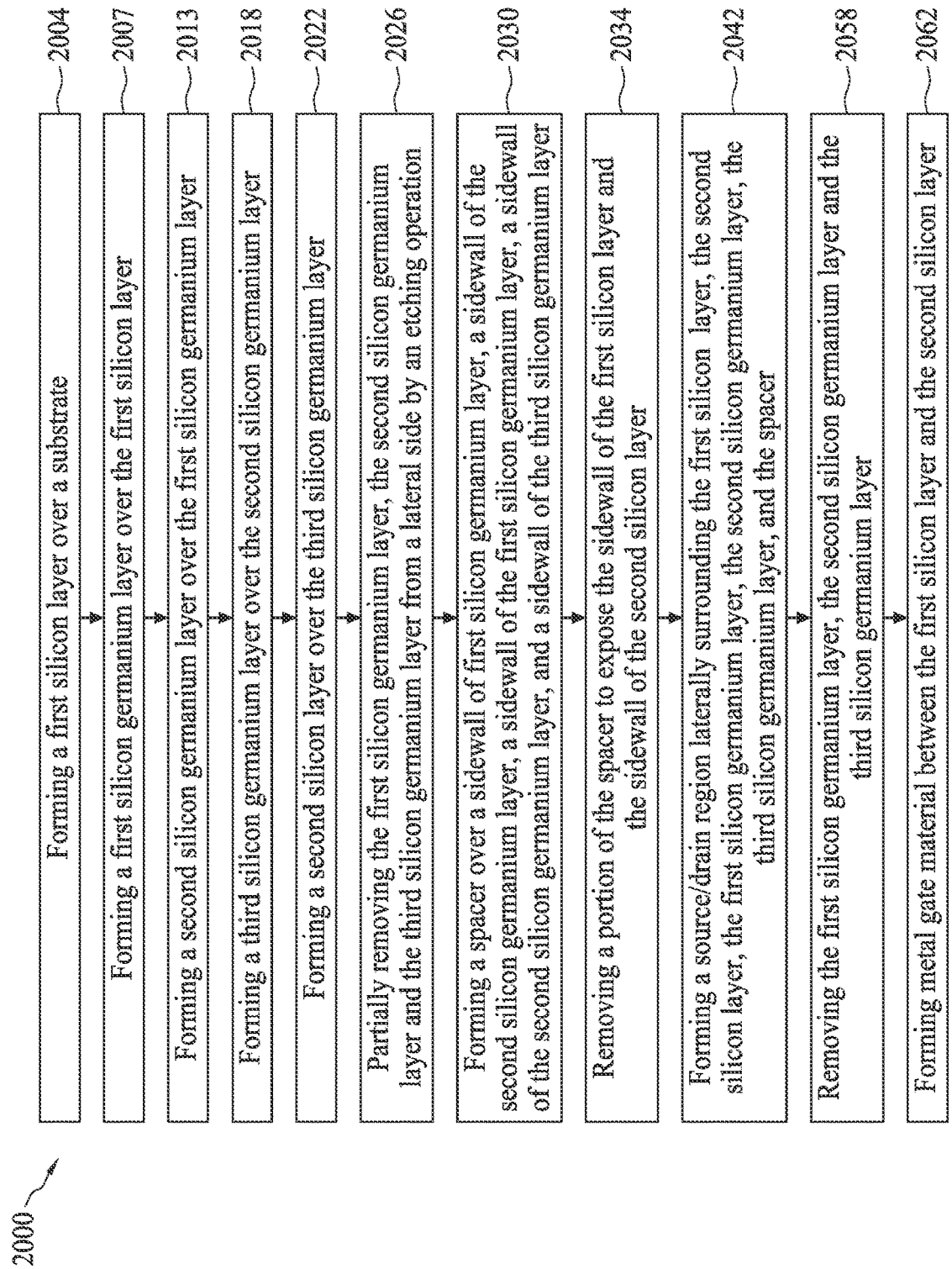
FIG. 3B shows a flow chart representing a method for fabricating a semiconductor structure, in accordance with some embodiments of the present disclosure.

Referring to FIG. 3B, FIG. 3B shows a flow chart representing a method for fabricating a semiconductor structure, in accordance with some embodiments of the present disclosure. The method 2000 for fabricating a semiconductor structure includes forming a first silicon layer over a substrate (operation 2004, which can be referred to FIG. 5), forming a first silicon germanium layer over the first silicon layer (operation 2007, which can be referred to FIG. 5), forming a second silicon germanium layer over the first silicon germanium layer (operation 2013, which can be referred to FIG. 5), forming a third silicon germanium layer over the second silicon germanium layer (operation 2018, which can be referred to FIG. 5), forming a second silicon layer over the third silicon germanium layer (operation 2022, which can be referred to FIG. 5), partially removing the first silicon germanium layer, the second silicon germanium layer and the third silicon germanium layer from a lateral side by an etching operation (operation 2026, which can be referred to FIG. 11A and FIG. 11B), forming a spacer over a sidewall of first silicon germanium layer, a sidewall of the second silicon germanium layer, a sidewall of the first silicon germanium layer, a sidewall of the second silicon germanium layer, and a sidewall of the third silicon germanium layer (operation 2030, which can be referred to FIG. 12), removing a portion of the spacer to expose the sidewall of the first silicon layer and the sidewall of the second silicon layer (operation 2034, which can be referred to FIG. 13), forming a source/drain region laterally surrounding the first silicon layer, the second silicon layer, the first silicon germanium layer, the second silicon germanium layer, the third silicon germanium layer, and the spacer (operation 2042, which can be referred to FIG. 14), removing the first silicon germanium layer, the second silicon germanium layer and the third silicon germanium layer (operation 2058, which can be referred to FIG. 17A and FIG. 17B), and forming metal gate material between the first silicon layer and the second silicon layer (operation 2062, which can be referred to FIG. 18A and FIG. 18B).

Figure 4:
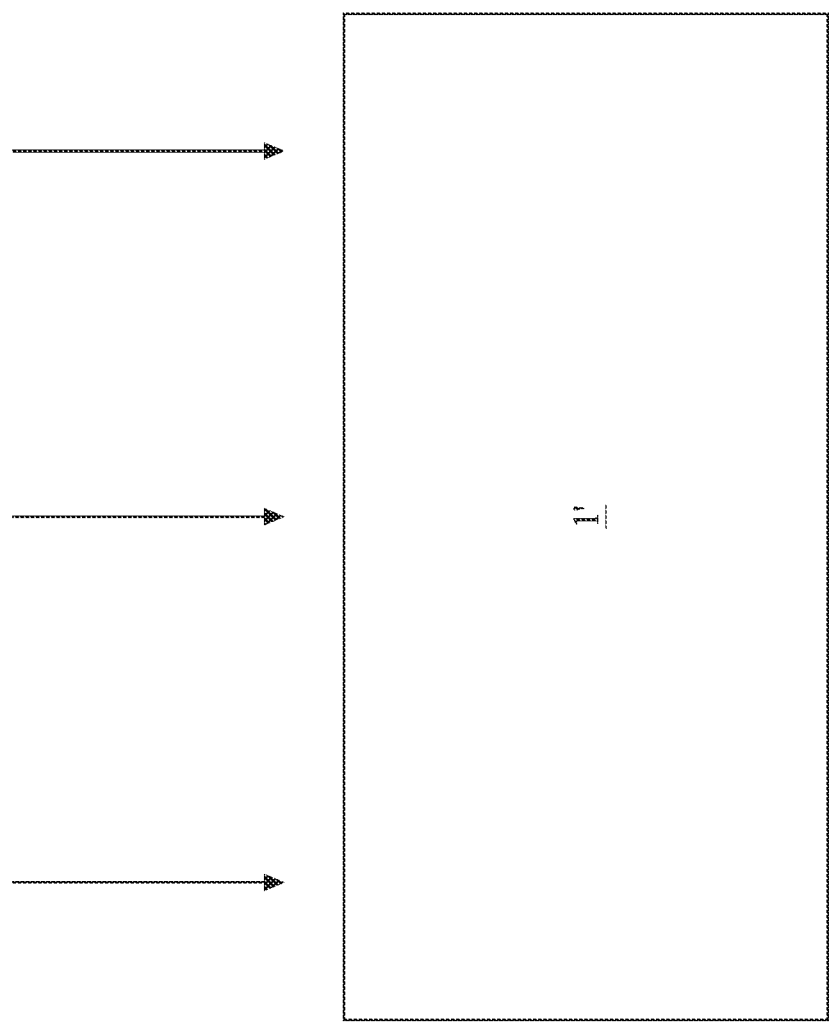
FIG. 4 to FIG. 10 are cross sectional views of a semiconductor structure during intermediate stages of manufacturing operations, according to some embodiments of the present disclosure.

Referring to FIG. 4, FIG. 4 is a cross sectional view of a semiconductor structure during intermediate stages of manufacturing operations, according to some embodiments of the present disclosure. A substrate 1' is provided. The substrate 1' may be a semiconductor substrate, such as a silicon substrate, a silicon-on-insulator substrate, or other suitable substrate. The substrate 1' may optionally be lightly doped with a p-type or an n-type impurity. An anti-punch-through (APT) implantation can optionally be performed. In some embodiments, well regions can be formed in the substrate 1' by implantation operation.

Figure 5:
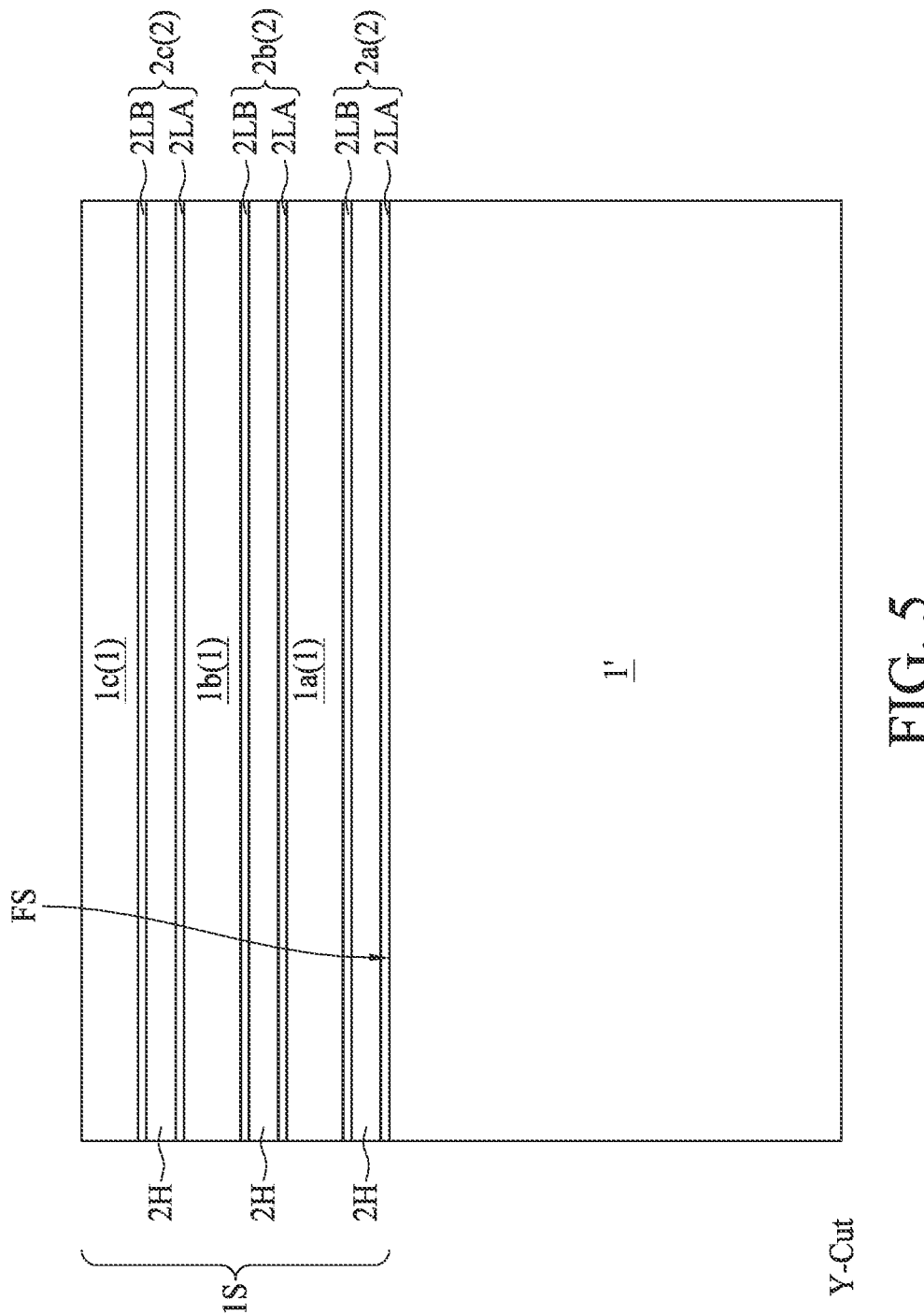

Referring to FIG. 5, FIG. 5 is a cross sectional view of a semiconductor structure during intermediate stages of manufacturing operations, according to some embodiments of the present disclosure. A semiconductor stack 1S is formed above a front side FS of the substrate 1'. The semiconductor stack 1S includes silicon layers 1 and SiGe stacks 2, wherein the silicon layers 1 and SiGe stacks 2 can be stacked alternatively. Specifically, a first SiGe stack 2a is formed above the front side FS of the substrate 1', a first silicon layer 1a is formed above the first SiGe stack 2a, a second SiGe stack 2b is formed above the first silicon layer 1a, a second silicon layer 1b is formed above the second SiGe stack 2b. In some embodiments, the stack can further be repeated. For example, a third SiGe stack 2c is formed above the second silicon layer 1b, a third silicon layer 1c is formed above the third SiGe stack 2c, and so on. The numbers of the silicon layer 1 and the SiGe stack 2 in the semiconductor stack 1S are not limited in the present disclosure.

As previously discussed in FIG. 2A to FIG. 2B, the SiGe stack 2 (herein using the second SiGe stack 2b as an example) includes a first silicon germanium layer 2LA formed over the first silicon layer 1a, a second silicon germanium layer 2H formed over the first silicon germanium layer 2LA, and a third silicon germanium layer 2LB formed over the second silicon germanium layer 2H, wherein the second silicon layer 1b is above the third silicon germanium layer 2LB. Herein the first silicon germanium layer 2LA has a first germanium concentration, the second silicon germanium layer 2H has a second germanium concentration, and the third silicon germanium layer 2LB has a third germanium concentration, wherein the second germanium concentration is greater than the first germanium concentration, and the third germanium concentration is less than the second germanium concentration. Herein each of the SiGe stack 2 can be formed through epitaxial formation operation, or other suitable operations.

Furthermore, in some embodiments, the thickness T2 of the second silicon germanium layer 2H may be in a range from about 2.5 nm to about 6.0 nm, and the thickness T1 of the first silicon germanium layer 2LA and the thickness T3 of the third silicon germanium layer 2LB may be in a range from about 1.0 nm to about 2.0 nm. In some embodiments, a germanium concentration (atomic percentage) of the second silicon germanium layer 2H may be in a range from about 30% to about 45%, a germanium concentration of the first silicon germanium layer 2LA and a germanium concentration (atomic percentage) of the third silicon germanium layer 2LB may be in a range from about 15% to about 25%. It is appreciated, however, that the values recited throughout the description are examples, and may be changed to different values.

Figure 6:
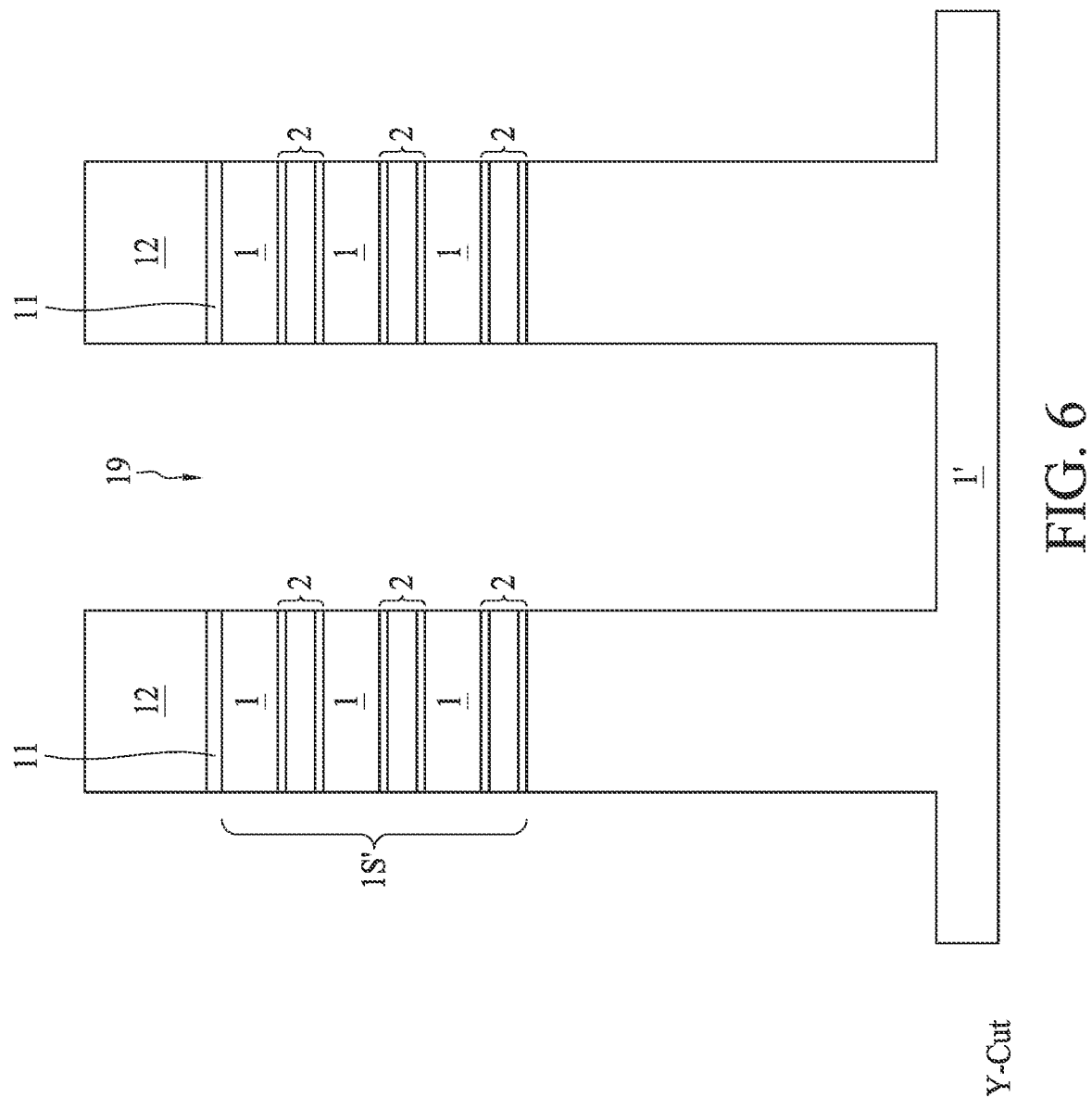

Referring to FIG. 6, FIG. 6 is a cross sectional view of a semiconductor structure during intermediate stages of manufacturing operations, according to some embodiments of the present disclosure. A mask 12 is formed over the semiconductor stack 1S. The mask 12 can be formed of silicon nitride, silicon oxynitride, silicon carbide, silicon carbo-nitride, or the like. Subsequently, the semiconductor stack 1S, including the silicon layer 1 and the SiGe stack 2, and a portion of the substrate 1' is patterned, thereby trenches 19 extending into the substrate 1' are formed. The mask 12 is subsequently removed. Optionally, an oxide layer 11 can be formed between the mask 12 and the semiconductor stack 1S. The remaining portions of the semiconductor stack 1S over the substrate 1' are hereinafter referred to as semiconductor strip 1S'.

Figure 7:
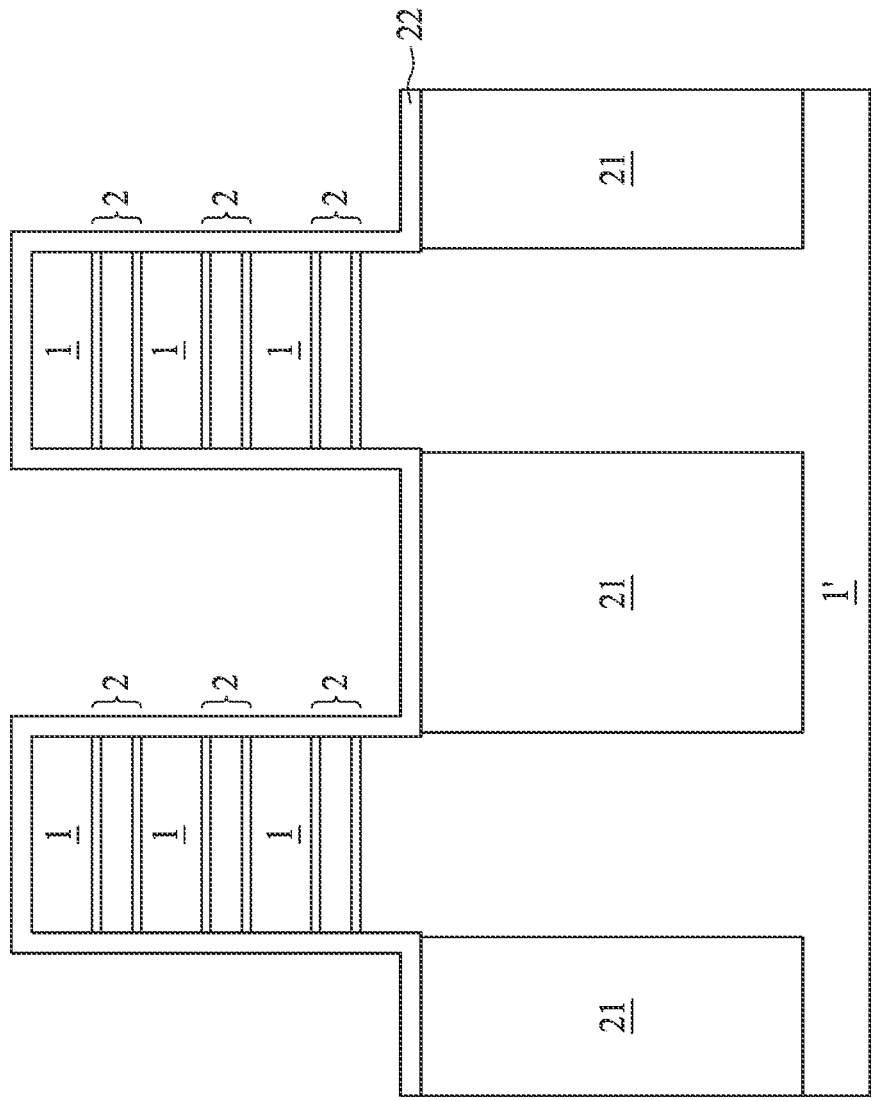

Referring to FIG. 7, FIG. 7 is a cross sectional view of a semiconductor structure during intermediate stages of manufacturing operations, according to some embodiments of the present disclosure. Isolation regions 21, which can be shallow trench isolation regions, can be formed in the trenches 19. The formation of the isolation regions 21 may include filling the trenches 19 with a dielectric layer using Flowable Chemical Vapor Deposition (FCVD, or other suitable deposition operations), and performing a chemical mechanical planarization (CMP) operation to level at a top surface of the mask 12. Subsequently the isolation regions 21 can be recessed, thereby a sidewall of the semiconductor strip 1S' is exposed from the material of the isolation regions 21. It should be noted that the isolation regions 21 may also be formed with other suitable operations. A dummy oxide layer 22 is subsequently formed over the top surface and the sidewall of the semiconductor strip 1S'. The dummy oxide layer 22 may optionally extend over the top surface of the isolation regions 21. In some embodiments, the dummy oxide layer 22 may include silicon oxide. In some embodiments, a material of the dummy oxide layer 22 may be identical with a material of the isolation regions 21 and/or the oxide layer 11 over the semiconductor strip 1S'. Therefore in some of the embodiments, the interfaces between the dummy oxide layer 22, the isolation regions 21 and/or the oxide layer 11 may not be distinguishable. In some alternative embodiments, those interfaces may be distinguishable.

Figure 8:
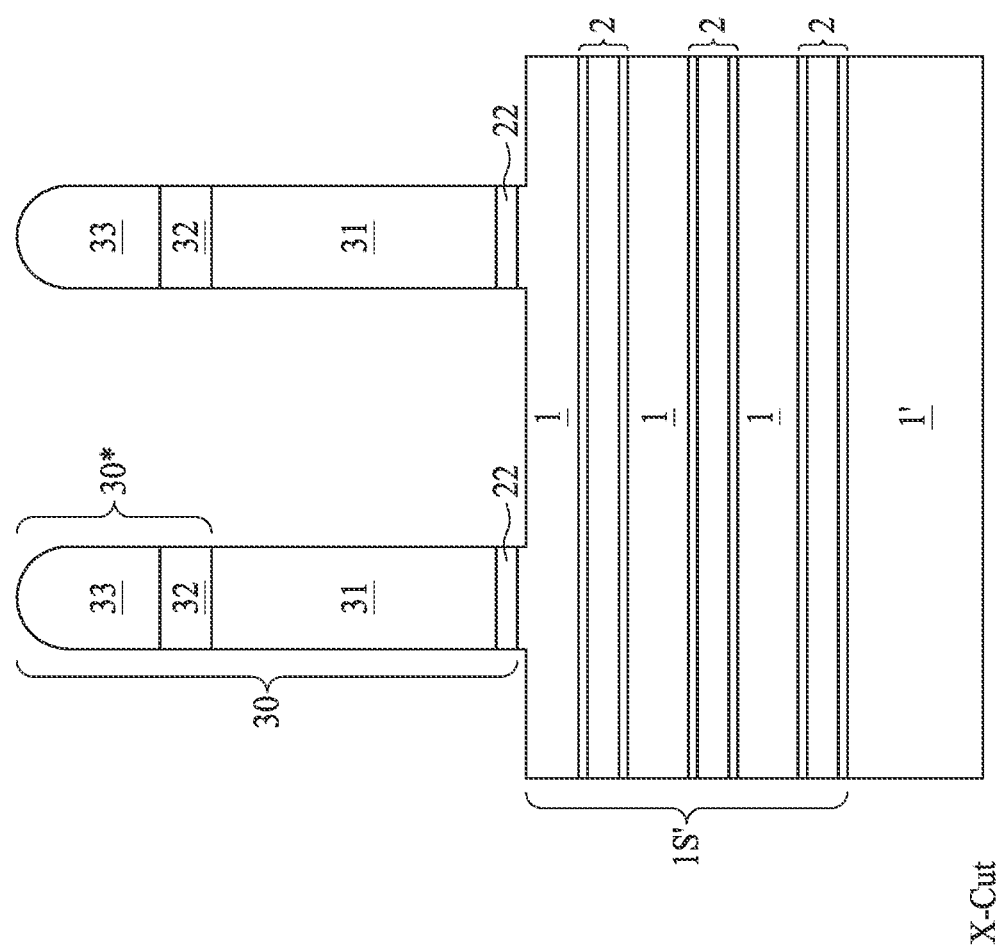

Referring to FIG. 8, FIG. 8 is a cross sectional view of a semiconductor structure during intermediate stages of manufacturing operations, according to some embodiments of the present disclosure. In some embodiments, a dummy gate stack 30 is formed over the semiconductor strip 1S' and the dummy oxide layer 22. In some embodiments, the dummy gate stack 30 may have a lengthwise direction orthogonal to a lengthwise direction of the semiconductor strip 1S'. The dummy gate stack 30 includes a dummy gate electrode 31 over the dummy oxide layer 22, wherein the dummy gate electrode 31 may include polysilicon or other suitable material that can be used as a sacrificial layer. The dummy gate stack 30 may further include a hard mask layer 30*. In some of the embodiments, the hard mask layer 30* may be a single layer (such as silicon nitride layer or silicon oxide layer), or alternatively, a composition of plurality of layers. For example, the hard mask layer 30* includes a silicon nitride layer 32 and a silicon oxide layer 33 over the silicon nitride layer 32.

Figure 9:
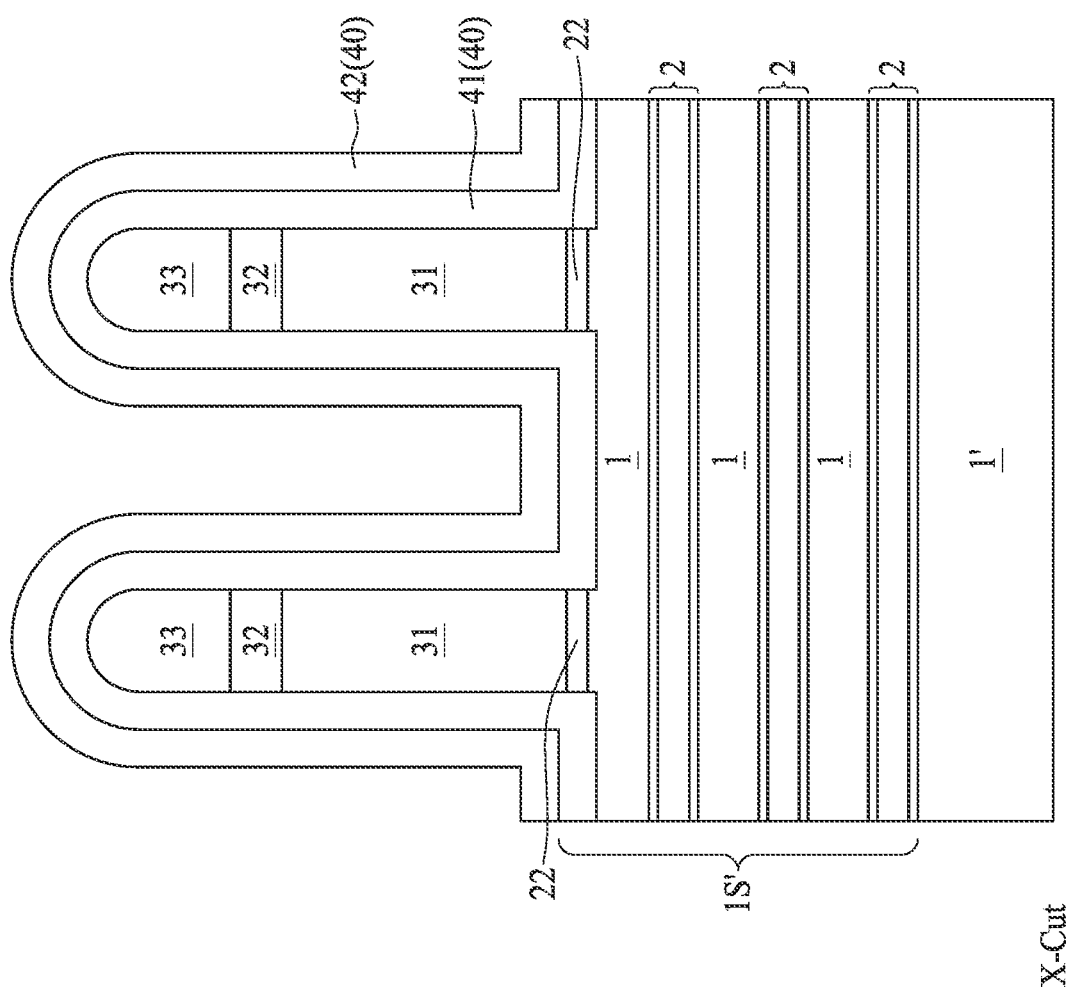

Referring to FIG. 9, FIG. 9 is a cross sectional view of a semiconductor structure during intermediate stages of manufacturing operations, according to some embodiments of the present disclosure. A gate spacer 40 is formed over the top surface and on the sidewall of the dummy gate stack 30. In some embodiments, the gate spacer 40 has a single layer structure, which may include silicon nitride, silicon oxide, or other similar materials which can be used as a protection spacer. Alternatively in some embodiments, as shown in the example provided in FIG. 9, the gate spacer 40 has a composite structure including a plurality of layers. For example, the gate spacer 40 may include a silicon oxide layer 41, and a silicon nitride layer 42 over the silicon oxide layer 41.

Figure 10:
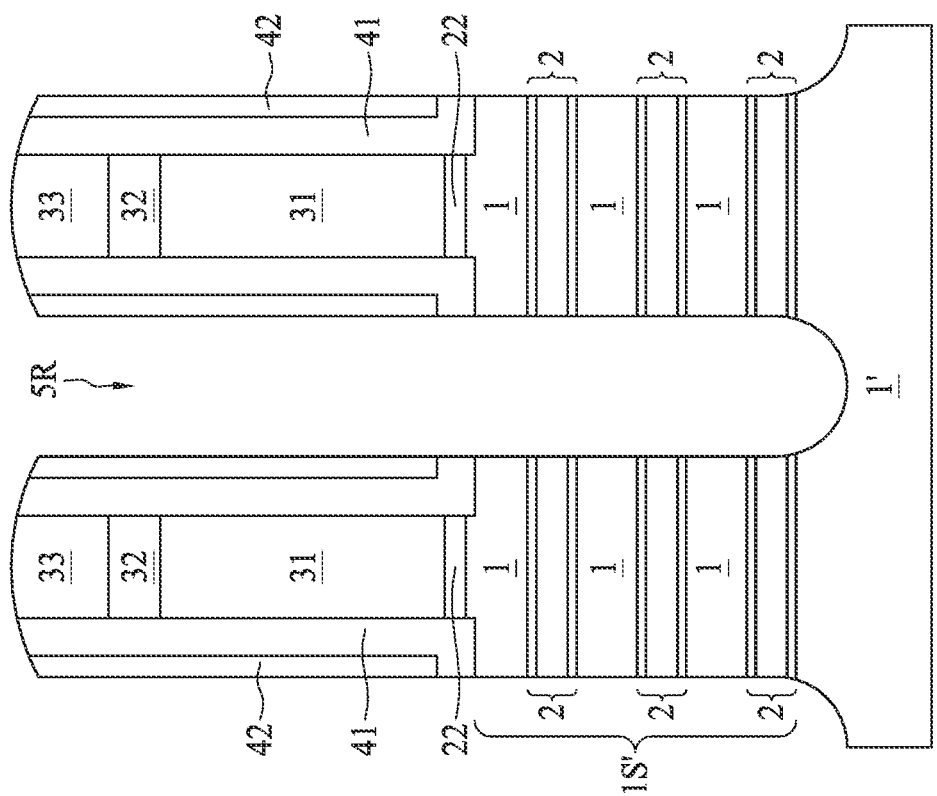

Referring to FIG. 10, FIG. 10 is a cross sectional view of a semiconductor structure during intermediate stages of manufacturing operations, according to some embodiments of the present disclosure. An etching operation is performed to remove a portion of the gate spacer 40, a portion of the semiconductor strip 1S' and/or a portion of the substrate 1'. As a result, the etching stops at the hard mask layer 30* (for example, the silicon oxide layer 33 is exposed from the gate spacer 40), and a recess 5R is formed between adjacent semiconductor strips 1S'.

Figure 11A:
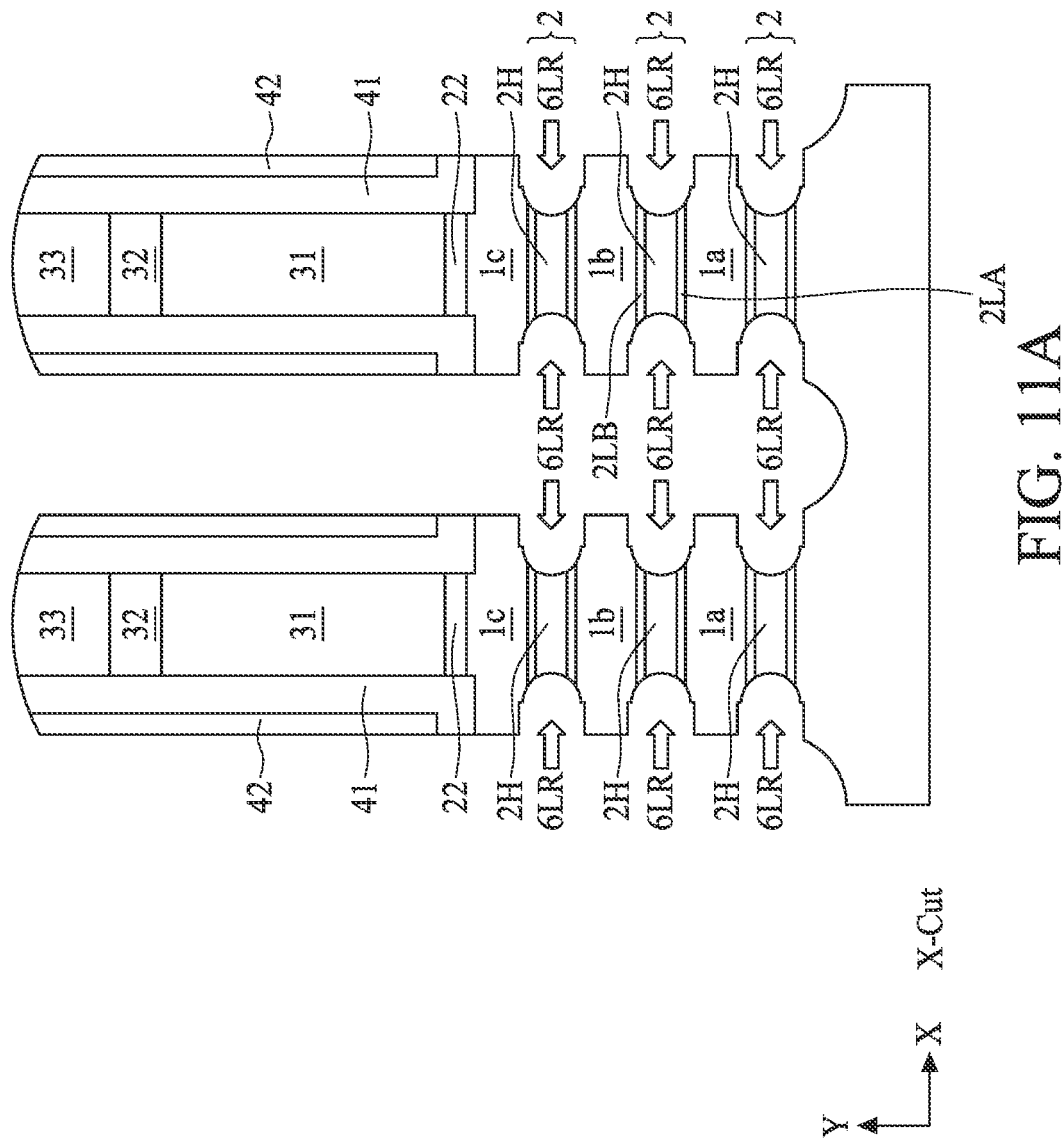
FIG. 11A is a cross sectional view of a semiconductor structure during intermediate stages of manufacturing operations, according to some embodiments of the present disclosure.

Referring to FIG. 11A, FIG. 11A is a cross sectional view of a semiconductor structure during intermediate stages of manufacturing operations, according to some embodiments of the present disclosure. The SiGe stacks 2 are partially and laterally removed. Specifically, the first silicon germanium layer 2LA, the second silicon germanium layer 2H, and the third silicon germanium layer 2LB are partially removed from a lateral side by the etching operation, thereby a lateral recess 6LR recessed from a sidewall of the SiGe stacks 2 is formed. A lower surface and a top surface of each of the silicon layers 1 is exposed after the etching operation. A portion of the substrate 1' may further be exposed from the SiGe stack 2 after the etching operation. As previously discussed in FIG. 1A to FIG. 2B, germanium concentration in the SiGe layer is pivotal to the etching selectivity between the SiGe layer and Si layer in the stack. Under such etching operation, the etching rate to the second silicon germanium layer 2H is greater than either the first silicon germanium layer 2LA or the third silicon germanium layer 2LB. As a result, a profile of the lateral recess 6LR as well as a profile of a surface of the silicon layer 1 reflects the distribution of the etching rate. The profiles will be subsequently discussed in FIG. 11A to FIG. 11D.

Figure 11B:
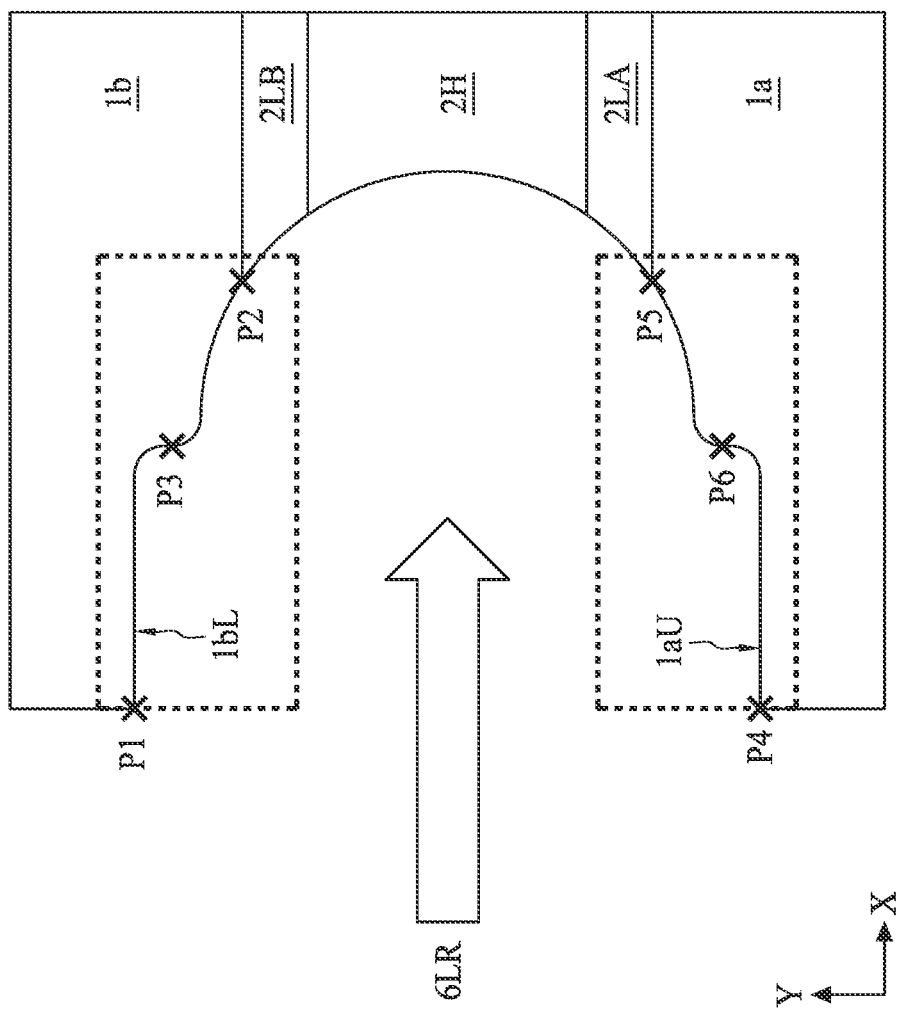
FIG. 11B is an enlarged cross sectional view of a semiconductor structure during intermediate stages of manufacturing operations, according to some embodiments of the present disclosure.
Figure 11C:
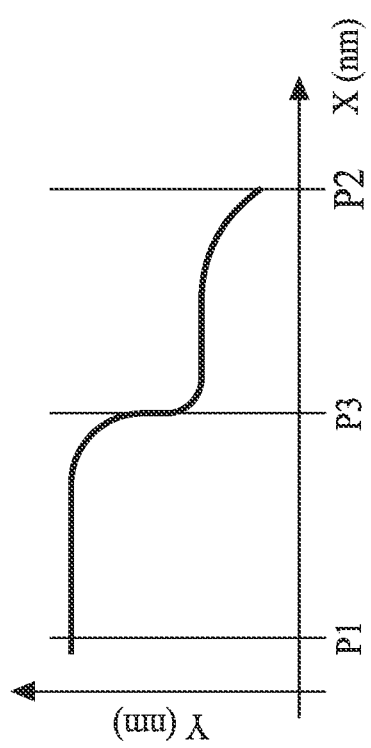
FIG. 11C is a schematic diagram showing a profile of a surface of a semiconductor layer, according to some embodiments of the present disclosure.
Figure 11D:
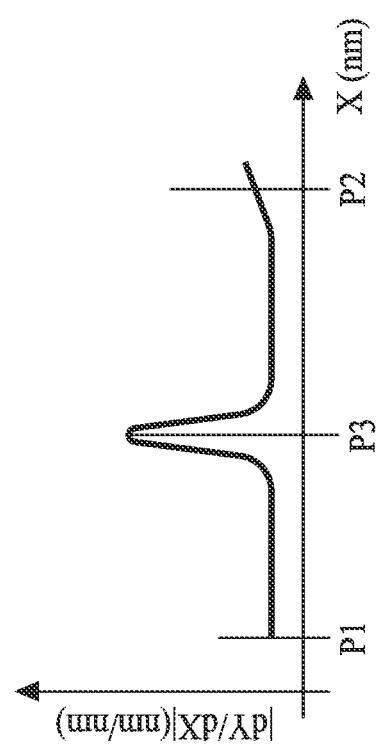
FIG. 11D is a schematic diagram showing a relationship between a position on a surface of a semiconductor layer and an absolute value of a derivative thereat, according to some embodiments of the present disclosure.

Referring to FIG. 11A, FIG. 11B, FIG. 11C, and FIG. 11D, FIG. 11B is an enlarged cross sectional view of a semiconductor structure during intermediate stages of manufacturing operations, FIG. 11C is a schematic diagram showing a profile of a surface of a semiconductor layer, FIG. 11D is a schematic diagram showing a relationship between a position on a surface of a semiconductor layer and an absolute value of a derivative thereat, according to some embodiments of the present disclosure. As a result of the distribution of the etching rate at the exposed lateral sidewall of the SiGe stack 2, a top surface of the substrate 1', a bottom surface of the silicon layer 1 (which may include the first silicon layer 1a, the second silicon layer 1b, and/or the third silicon layer 1c) of the semiconductor strip 1S', and/or a top surface of the silicon layer 1 may have a unique profile. Specifically, since the inter-diffusion of germanium proximal to the interface at the surfaces of the silicon layer 1 are alleviated with the configuration of the first silicon germanium layer 2LA as well as the third silicon germanium layer 2LB, instead of having the silicon layer 1 being in direct contact with the second silicon germanium layer 2H having a higher germanium concentration, an etching rate at a position proximal to the interface between the silicon layer 1 and the SiGe stack 2 is relatively lower than an etching rate at a position at an exposed surface of the second silicon germanium layer 2H.

Therefore, it can be observed that the lateral recess 6LR has a necking structure, that is, having an intermediate section between a wider portion proximal to the sidewall of the silicon layer 1 and a narrower portion distal to the sidewall of the silicon layer 1. Alternatively stated, herein using a lower surface 1bL of the second silicon layer 1b as an example (same surface profile may be observed on other silicon layers 1 as well), the lower surface 1bL of the second silicon layer 1b has a first section P1 proximal to an outer sidewall of the second silicon layer 1b (after forming an S/D region 81, as will be discussed in FIG. 14, the first section P1 is proximal to the S/D region 81), a second section P2 proximal to the remaining SiGe stack 2 (after forming a gate material 93 between the first silicon layer 1a and the second silicon layer 1b, as will be discussed in FIG. 18A to FIG. 18B, the second section P2 is proximal to the gate material 93), and a third section P3 between the first section P1 and the second section P2. The profile of the lower surface 1bL of the second silicon layer 1b and the position of the first section P1, the second section P2, and the third section P3 can be referred to FIG. 11B and FIG. 11C.

As shown in FIG. 11D, the feature of the profile of the lower surface 1bL of the second silicon layer 1b can further be represented by an absolute value of a first derivative derived from the surface profile in the FIG. 11C, that is, each value in the diagram of the FIG. 11D represents a local slope value of the correspond position at the lower surface 1bL of the second silicon layer 1b. It should be noted that a necking portion can be identified as having a greater local slope value comparing with other section. In some embodiments, the third section P3 is at the necking portion, thus the absolute value of a derivative (absolute value of local slope value) at the third section P3 is greater than either the absolute value of a derivative (absolute value of local slope value) at the first section P1 or at the second section P2. Specifically, an absolute value of a derivative at the third section P3 is in a range from about 0.3 to about 2.0, and the absolute values of a derivative at the first section P1 and at the second section P2 are both less than the absolute value of a derivative at the third section P3. In some embodiments, the absolute value of a derivative at the first section P1 is less than 0.3. In some embodiments, the absolute value of a derivative at the second section P2 is less than 0.3. It should be noted that similar profile can also be found on other lower surfaces of the silicon layers 1, such as (but not limited to) the first silicon layer 1a and/or the third silicon layer 1c, or the like. It should also be noted that in the present disclosure, the absolute value of a derivative (or an absolute value of a local slope value) can be represented as |dy/dx|, wherein the direction x and y are shown in FIG. 11A and FIG. 11B.

In some embodiments, a similar profile can also be observed on an upper surface 1aU of the first silicon layer 1a, wherein the upper surface 1aU of the first silicon layer 1a has a fourth section P4 proximal to an outer sidewall of the first silicon layer 1b (after forming an S/D region 81, as will be discussed in FIG. 14, the fourth section P4 is proximal to the S/D region 81), a fifth section P5 proximal to the remaining SiGe stack 2 (after forming a gate material 93 between the first silicon layer 1a and the second silicon layer 1b, as will be discussed in FIG. 18A to FIG. 18B, the fifth section P5 is proximal to the gate material 93), and a sixth section P6 between the fourth section P4 and the fifth section P5. The profile of the upper surface 1aU of the first silicon layer 1a and the position of the fourth section P4, the fifth section P5, and the sixth section P6 can be referred to FIG. 11B and FIG. 11C.

Similarly, the sixth section P6 is at the necking section, thus the absolute value of a derivative (absolute value of local slope value) at the sixth section P6 is greater than either the absolute value of a derivative (absolute value of local slope value) at the fourth section P4 or at the fifth section P5. Specifically, an absolute value of a derivative at the sixth section P6 is in a range from about 0.3 to about 2.0, and the absolute values of a derivative at the fourth section P4 and at the fifth section P5 are both less than the absolute value of a derivative at the sixth section P6. In some embodiments, the absolute value of a derivative at the fourth section P4 is less than 0.3. In some embodiments, the absolute value of a derivative at the fifth section P5 is less than 0.3. It should be noted that similar profile can also be found on other upper surfaces of the silicon layers 1 or the substrate 1', such as (but not limited to) the second silicon layer 1b and/or the third silicon layer 1c, or the like.

Figure 12:
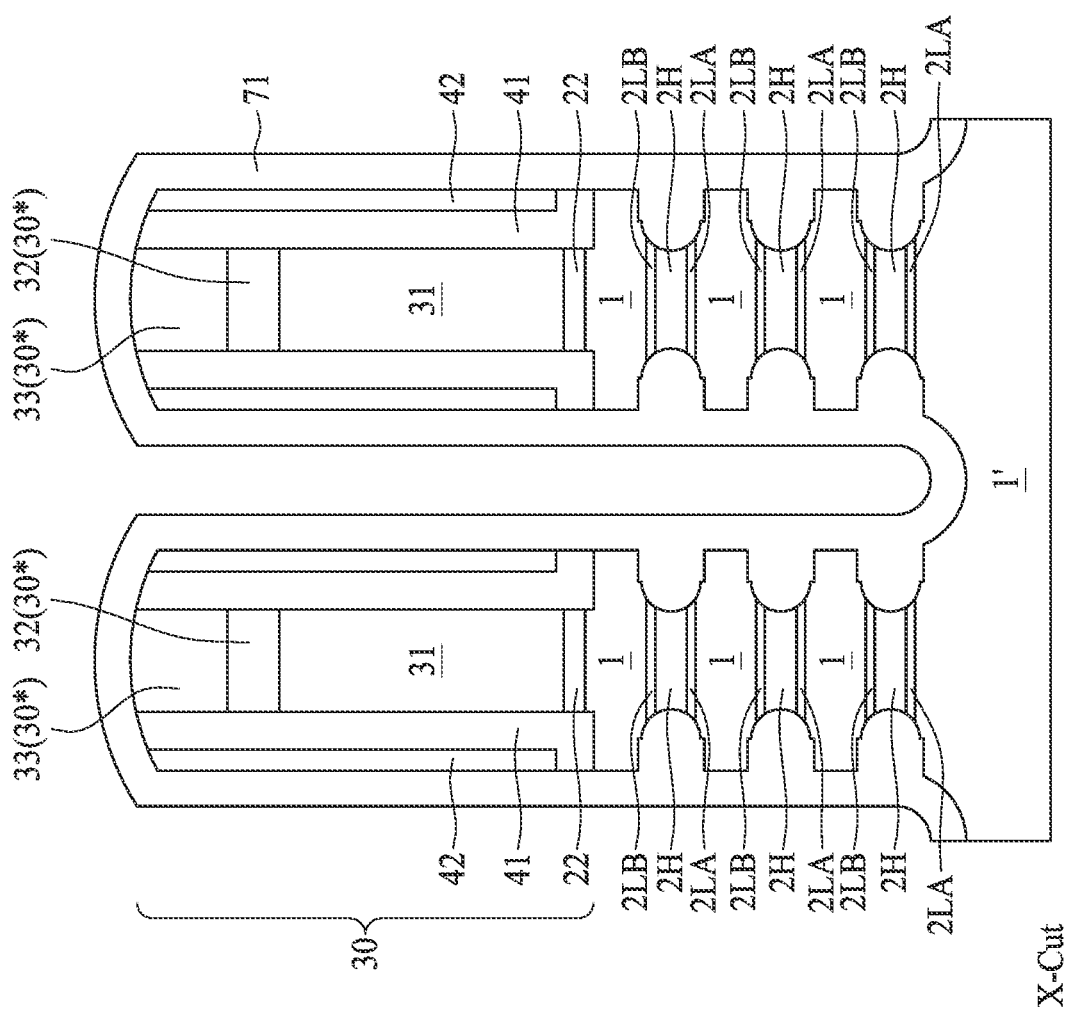
FIG. 12 to FIG. 15 are cross sectional views of a semiconductor structure during intermediate stages of manufacturing operations, according to some embodiments of the present disclosure.

Referring to FIG. 12, FIG. 12 is a cross sectional view of a semiconductor structure during intermediate stages of manufacturing operations, according to some embodiments of the present disclosure. A spacer 71 is formed to cover a sidewall of the silicon layers 1 (including sidewalls of the first silicon layer 1a, the second silicon layer 1b, and/or the third silicon layer 1c, or the like), a sidewall of the SiGe stack 2 (including sidewalls of the first silicon germanium layer 2LA, the second silicon germanium layer 2H, and/or the third silicon germanium layer 2LB, or the like), a sidewall of the gate spacer 40 and a top surface of the substrate 1', and may further cover the exposed surface of the dummy gate stack 30 (such as a top surface of the hard mask layer 30*). Furthermore, the spacer 71 is filled in the lateral recesses 6LR and conforms to the profile of the lateral recesses 6LR.

Figure 13:
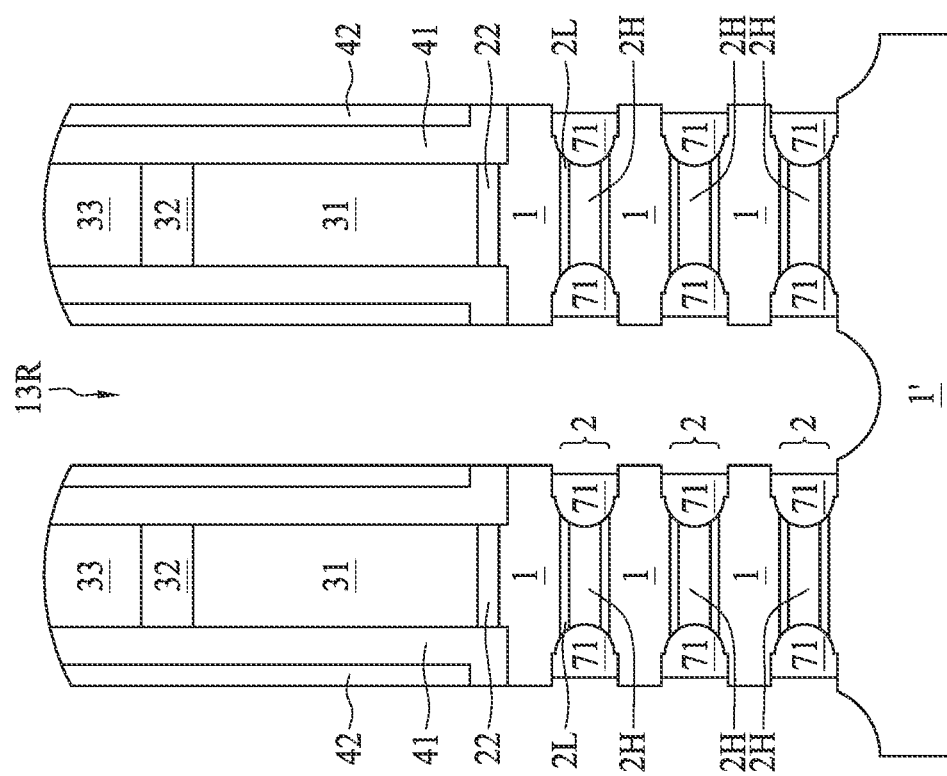

Referring to FIG. 13, FIG. 13 is a cross sectional view of a semiconductor structure during intermediate stages of manufacturing operations, according to some embodiments of the present disclosure. A portion of the spacer 71 is removed by etching operation to expose the sidewall of the silicon layers 1 (including sidewalls of the first silicon layer 1a, the second silicon layer 1b, and/or the third silicon layer 1c, or the like). A recess 13R is thereby formed. Furthermore, an outer sidewall of the spacer 71 is recessed from the sidewall of the silicon layers 1 for enhancing the formation of S/D region 81, as will be introduced in FIG. 14.

Figure 14:
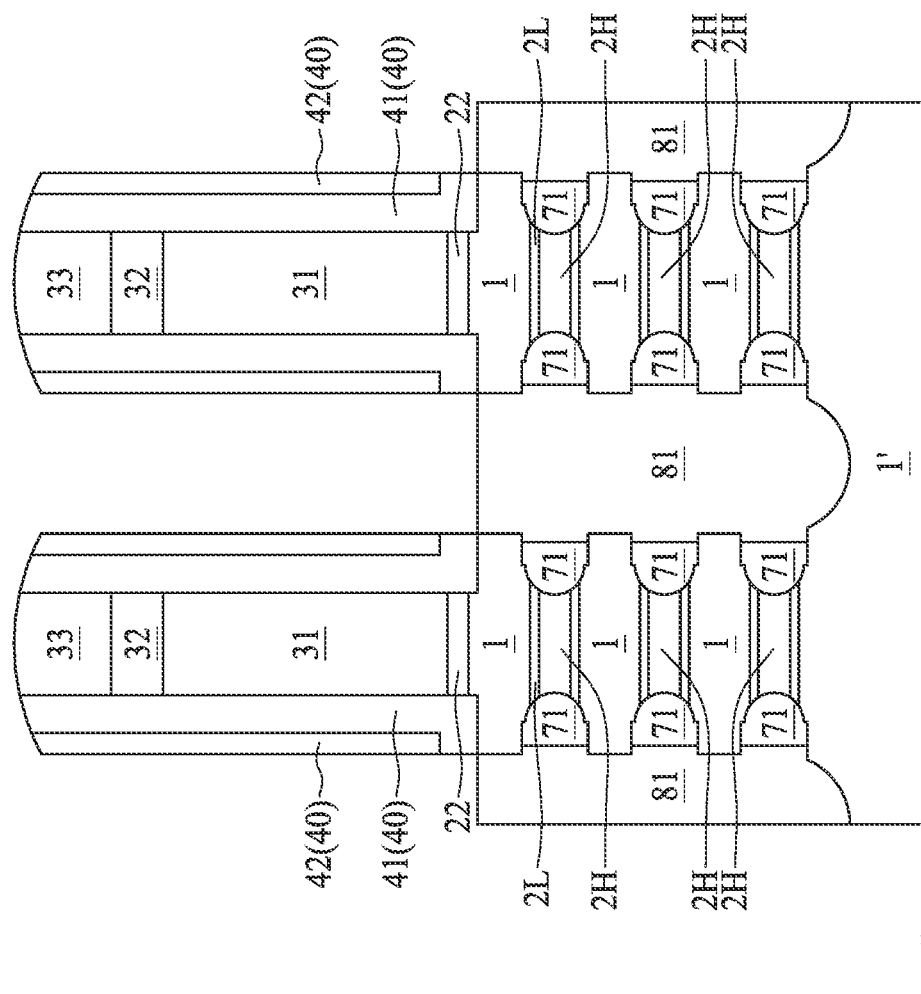

Referring to FIG. 14, FIG. 14 is a cross sectional view of a semiconductor structure during intermediate stages of manufacturing operations, according to some embodiments of the present disclosure. A source/drain (S/D) region 81 can be formed by growing a semiconductor material in the recess 13R (shown in FIG. 13), which may include performing epitaxial growth operations. After forming the S/D region 81, the S/D region 81 is in direct contact with the outer sidewall of the spacer 71 and the outer sidewall of the silicon layers 1. The S/D region 81 surrounds the silicon layers 1 (including the first silicon layer 1a, the second silicon layer 1b, and/or the third silicon layer 1c, or the like), and the SiGe stack 2 (including the first silicon germanium layer 2LA, the second silicon germanium layer 2H, and/or the third silicon germanium layer 2LB, or the like). As previously discussed in FIG. 13, since the outer sidewall of the spacer 71 is recessed from the sidewall of the silicon layers 1, a portion of the S/D region 81 extrudes toward the spacer 71 and is in direct contact with a portion of the upper surface and/or a portion of the lower surface of the silicon layers 1 (similar to the enlarged cross sectional view shown in FIG. 18C). In some embodiments, a thickness TB (shown in FIG. 18C) of the extrusion of the S/D region 81 is in a range from about 0.5 nm to about 2.0 nm to enhance the formation by providing additional spacing during epitaxial growth operation.

Figure 15:
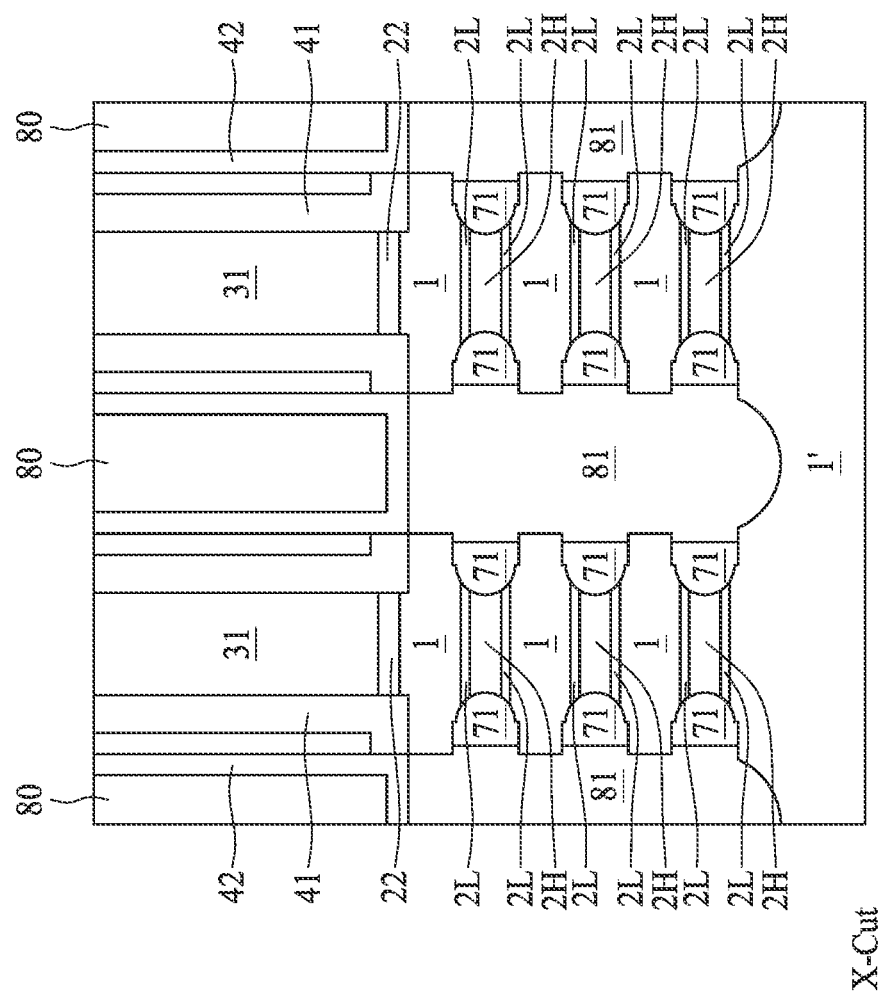

Referring to FIG. 15, FIG. 15 is a cross sectional view of a semiconductor structure during intermediate stages of manufacturing operations, according to some embodiments of the present disclosure. An inter-layer dielectric (ILD) 80 is formed over the S/D region 81. A CMP operation is then performed to remove a portion of the ILD 80, a portion of the gate spacer 40, and a portion of the dummy gate stack 30. Thereby a top surface of the gate spacer 40, a top surface of ILD 80 and a top surface of the dummy gate electrode 31 are leveled.

Referring to FIG. 16A and FIG. 16B, FIG. 16A and FIG. 16B are cross sectional views of a semiconductor structure during intermediate stages of manufacturing operations, according to some embodiments of the present disclosure. Herein FIG. 16B is a schematic drawing illustrating a cross sectional view taken along line A-A' of FIG. 16A. The dummy gate electrode 31 is then removed to expose the dummy oxide layer 22. Herein the remaining dummy oxide layer 22 can be referred to as interfacial oxide layer.

Figure 17B:
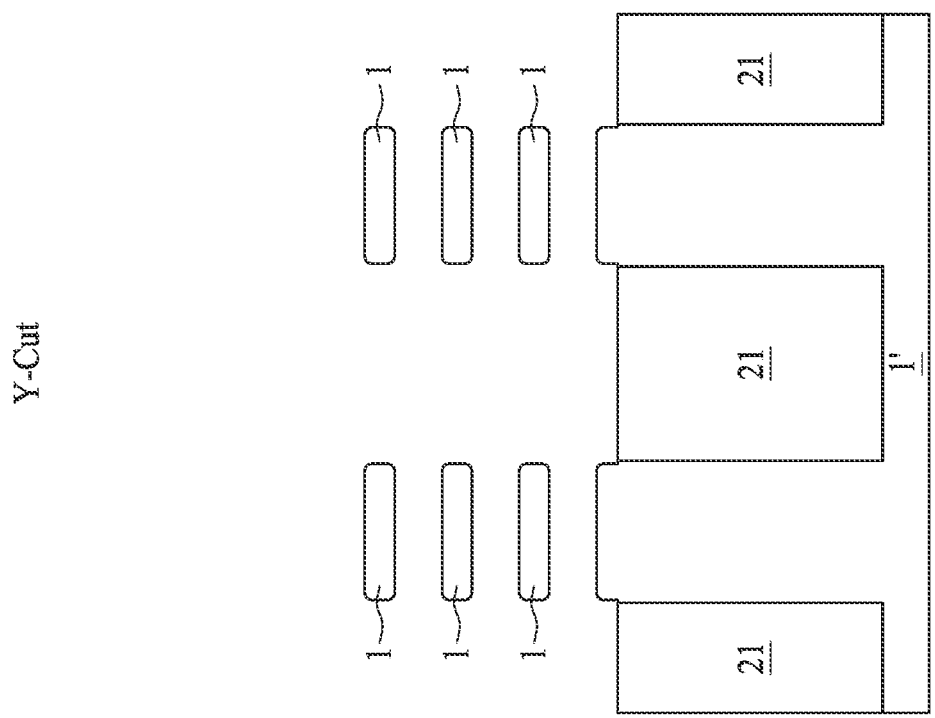
FIG. 17B is a schematic drawing illustrating a cross sectional view taken along line B-B' of FIG. 17A, according to some embodiments of the present disclosure.
Figure 17A:
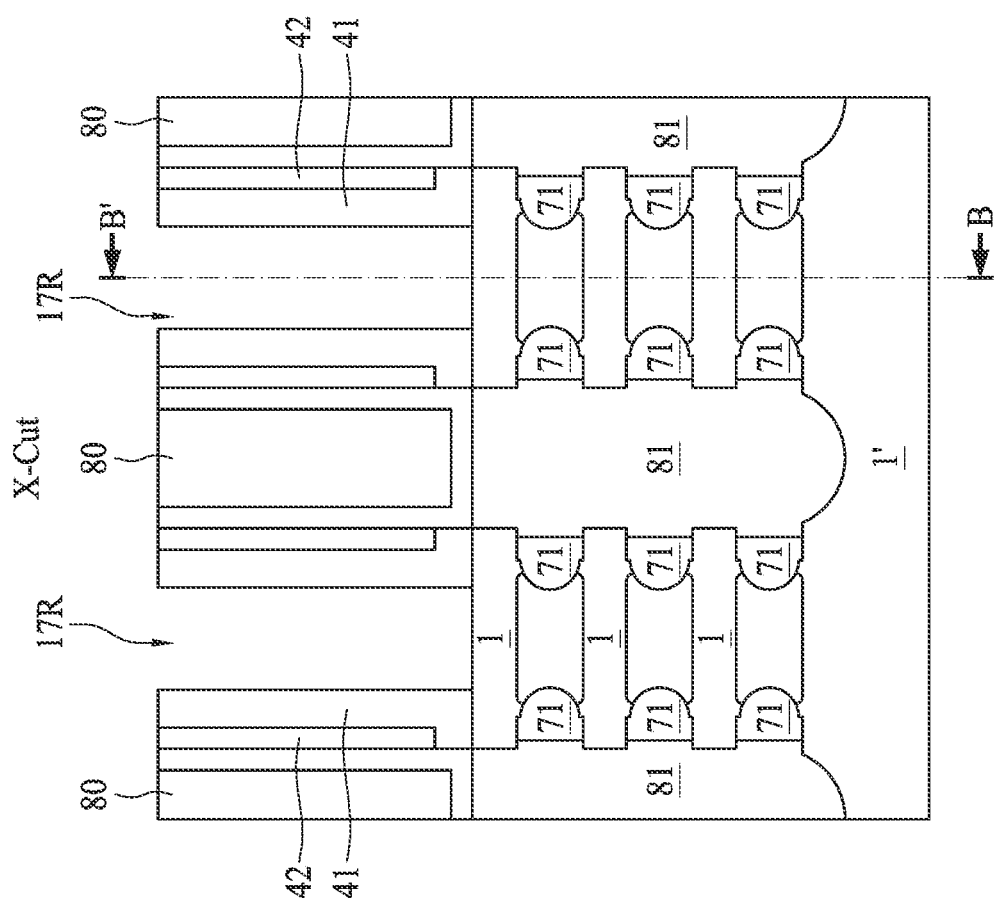
FIG. 17A is a cross sectional view of a semiconductor structure during intermediate stages of manufacturing operations, according to some embodiments of the present disclosure.

Referring to FIG. 17A and FIG. 17B, FIG. 17A is a cross sectional view of a semiconductor structure during intermediate stages of manufacturing operations, FIG. 17B is a schematic drawing illustrating a cross sectional view taken along line B-B' of FIG. 17A, according to some embodiments of the present disclosure. The remaining SiGe stack 2 between the silicon layers 1 are removed by etching operation, thereby forming gaps between silicon layers 1 and a recess 17R between the gate spacer 40. Furthermore, the dummy oxide layer 22 is also removed.

Figure 18B:
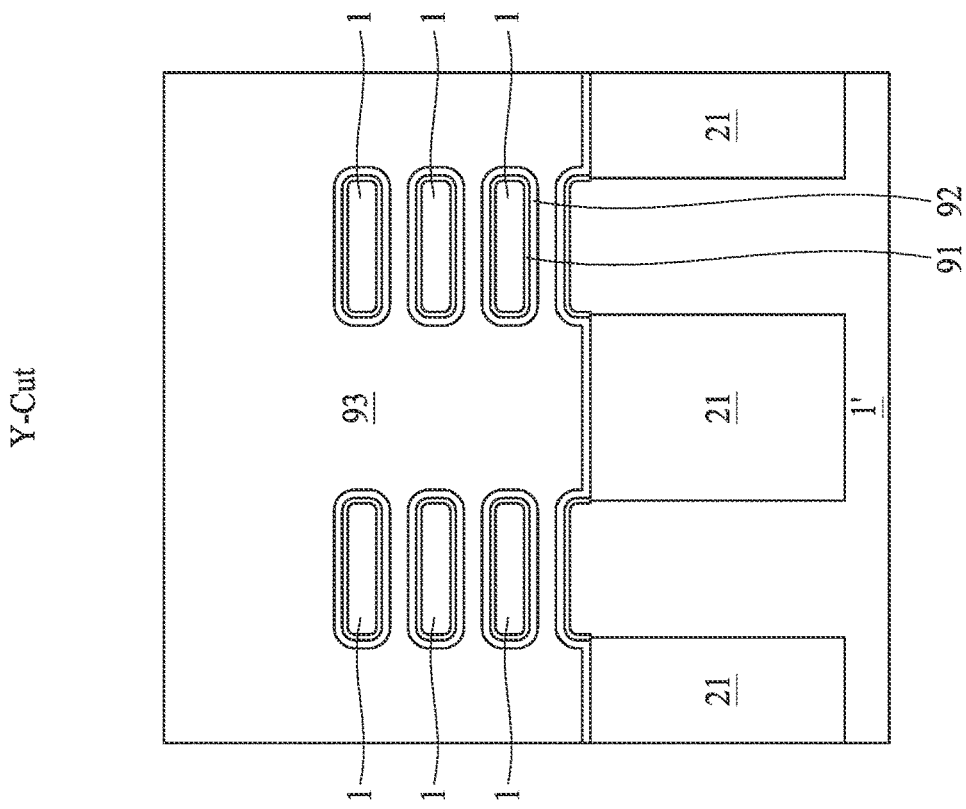
FIG. 18B is a schematic drawing illustrating a cross sectional view taken along line C-C' of FIG. 18A, according to some embodiments of the present disclosure.
Figure 18A:
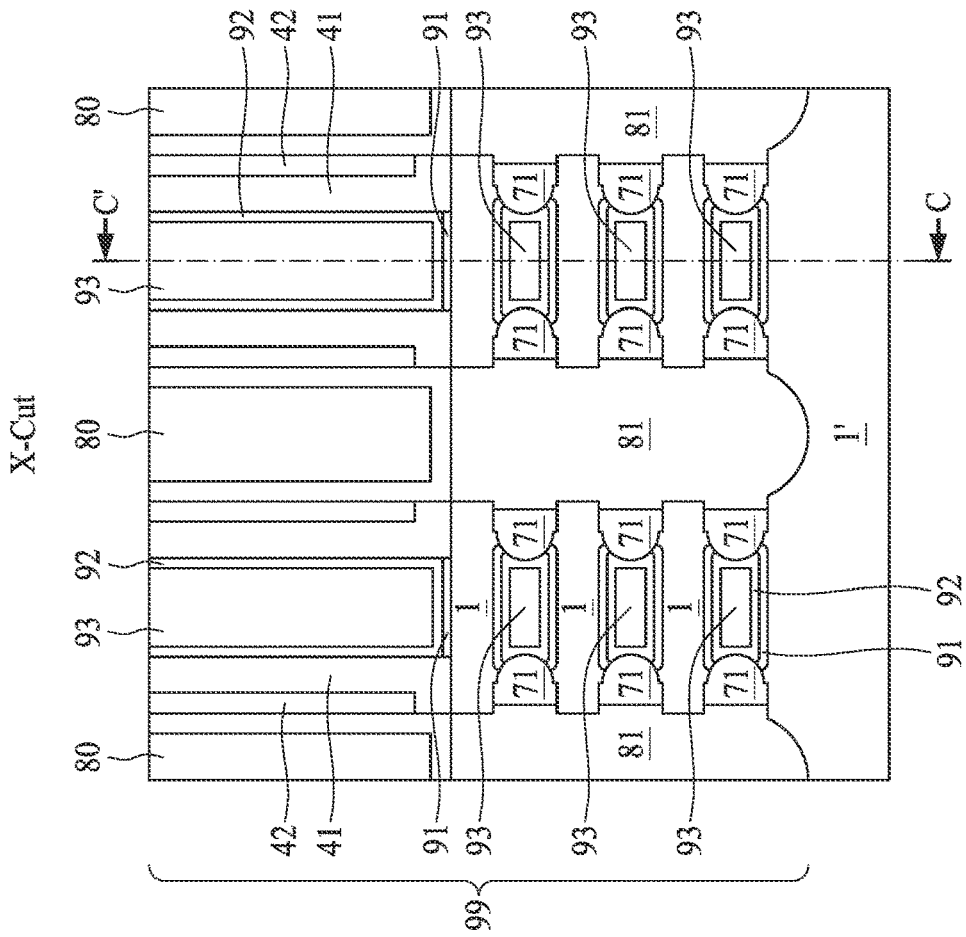
FIG. 18A is a cross sectional views of a semiconductor structure during intermediate stages of manufacturing operations, according to some embodiments of the present disclosure.

Referring to FIG. 18A and FIG. 18B, FIG. 18A is a cross sectional view of a semiconductor structure during intermediate stages of manufacturing operations, FIG. 18B is a schematic drawing illustrating a cross sectional view taken along line C-C' of FIG. 18A, according to some embodiments of the present disclosure. An interfacial layer 91 is formed on the exposed surfaces of the silicon layers 1 and an inner sidewall of the spacer 71, a high-k dielectric layer 92 is formed on the interfacial layer 91, an inner sidewall of the spacer 71 and/or on the inner sidewall of the recess 17R, and a gate material 93 is filled into the gaps between the silicon layers 1 and/or in the recess 17R. The gate material 93 may be a metal-containing material, such as TiN, TaN, TaC, Co, Ru, Al, Cu, W, combination thereof, or the like. Thereby, a fin 99 protruding from the front surface of the substrate 1' is formed. From the cross section view as shown in FIG. 18A, the gate material 93 is surrounded by the high-k dielectric layer 92, and the high-k dielectric layer 92 is surrounded by the interfacial layer 91. The spacer 71 may be in direct contact with the high-k dielectric layer 92 and/or the interfacial layer 91, wherein the gate material 93 and the spacer 71 may be separated by the high-k dielectric layer 92. From the cross section view as shown in FIG. 18B, the silicon layer 1 is surrounded by the interfacial layer 91, the interfacial layer 91 is surrounded by the high-k dielectric layer 92, and the gate material 93 is formed between adjacent high-k dielectric layers 92 and above the silicon layers 1. Hereinafter the interfacial layer 91, the high-k dielectric layers 92 and the gate material 93 are collectively referred to as a gate 90.

Figure 18C:
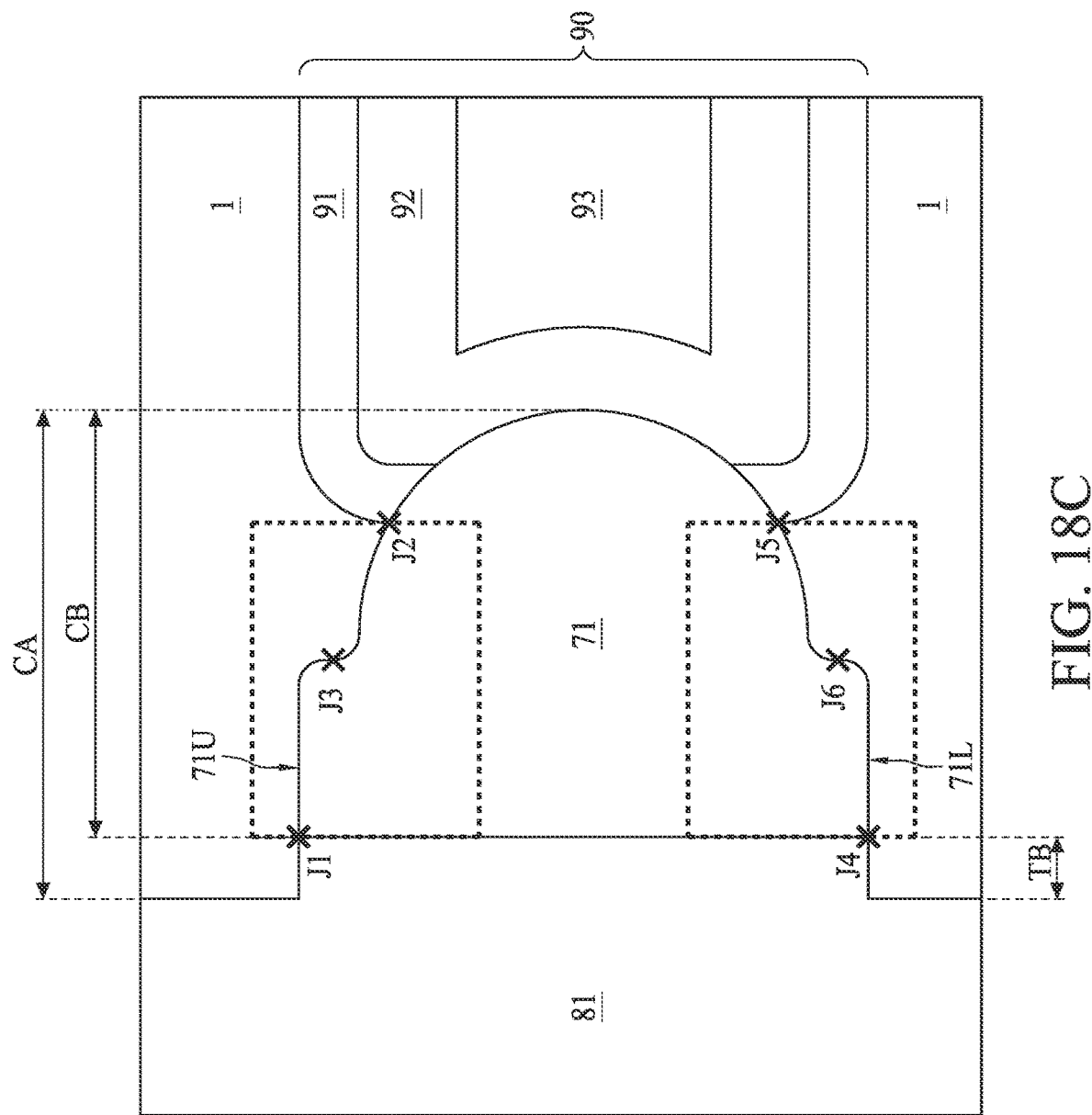
FIG. 18C is an enlarged cross sectional view of a semiconductor structure during intermediate stages of manufacturing operations, according to some embodiments of the present disclosure.
Figure 18D:
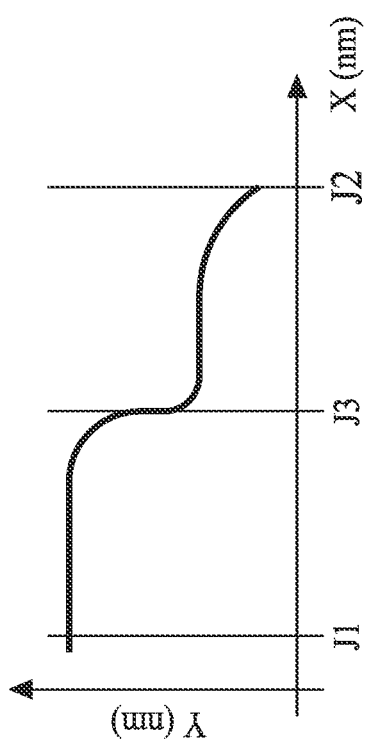
FIG. 18D is a schematic diagram showing a profile of a surface of a spacer, according to some embodiments of the present disclosure.
Figure 18E:
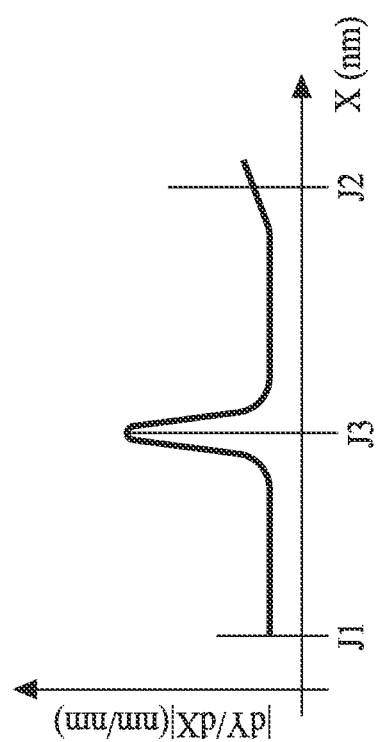
FIG. 18E is a schematic diagram showing a relationship between a position on a surface of a spacer and an absolute value of a derivative thereat, according to some embodiments of the present disclosure.

Referring to FIG. 18C, FIG. 18D, and FIG. 18E, FIG. 18C is an enlarged cross sectional view of a semiconductor structure during intermediate stages of manufacturing operations, FIG. 18D is a schematic diagram showing a profile of a surface of a spacer, FIG. 18E is a schematic diagram showing a relationship between a position on a surface of a spacer and an absolute value of a derivative thereat, according to some embodiments of the present disclosure. Since a surface of the spacer 71 conforms to the lateral recess 6LR as shown in FIG. 11A to FIG. 11B, the spacer 71 also has a necking portion between a wider portion proximal to the sidewall of the silicon layer 1 and a narrower portion proximal to the gate material 93. The spacer 71 has an upper surface 71U and a lower surface 71L opposite to the upper surface 71U. Using a spacer 71 between the first silicon layer 1a and the second silicon layer 1b as an example, the upper surface 71U of the spacer 71 conforms to the lower surface 1bL of the second silicon layer 1b, and the lower surface 71L of the spacer 71 conforms to the upper surface 1aU of the first silicon layer 1a.

Herein the upper surface 71U of the spacer 71 has a first section J1 proximal to the S/D region 81, a second section J2 proximal to the gate material 93 of the gate 90, and a third section J3 between the first section J1 and the second section J2. The profile of the l upper surface 71U and the position of the first section J1, the second section J2, and the third section J3 can be referred to FIG. 18C and FIG. 18D. As shown in FIG. 18E, the feature of the profile of the upper surface 71U of the spacer 71 can further be represented by an absolute value of a first derivative derived from the surface profile in the FIG. 18D, that is, each value in the diagram of the FIG. 18E represents a local slope value of the correspond position at the upper surface 71U of the spacer 71. In some embodiments, the third section J3 is at the necking portion, thus the absolute value of a derivative (absolute value of local slope value) at the third section J3 is greater than either the absolute value of a derivative (absolute value of local slope value) at the first section J1 or at the second section J2. Specifically, an absolute value of a derivative at the third section J3 is in a range from about 0.3 to about 2.0, and the absolute values of a derivative at the first section J1 and at the second section J2 are both less than the absolute value of a derivative at the third section J3. In some embodiments, the absolute value of a derivative at the first section J1 is less than 0.3. In some embodiments, the absolute value of a derivative at the second section J2 is less than 0.3. It should be noted that similar profile can also be found on other spacers 71.

In some embodiments, a similar profile can also be observed on the lower surface 71L of the spacer 71, wherein the lower surface 71L of the spacer 71 has a fourth section J4 proximal to the S/D region 81, a fifth section J5 proximal to the gate material 93 of the gate 90, and a sixth section J6 between the fourth section J4 and the fifth section J5. The profile of the lower surface 71L of the spacer 71 and the position of the fourth section J4, the fifth section J5, and the sixth section J6 can be referred to FIG. 18C and FIG. 18D. Similarly, the sixth section P6 is at the necking portion, thus the absolute value of a derivative (absolute value of local slope value) at the sixth section J6 is greater than either the absolute value of a derivative (absolute value of local slope value) at the fourth section P4 or at the fifth section J5. Specifically, an absolute value of a derivative at the sixth section J6 is in a range from about 0.3 to about 2.0, and the absolute values of a derivative at the fourth section J4 and at the fifth section J5 are both less than the absolute value of a derivative at the sixth section J6. In some embodiments, the absolute value of a derivative at the fourth section J4 is less than 0.3. In some embodiments, the absolute value of a derivative at the fifth section J5 is less than 0.3. It should be noted that similar profile can also be found on other spacers 71.

The present disclosure provides a semiconductor structure and a method for forming semiconductor structure. Specifically, in order to effectively remove a SiGe layer between two silicon layers (in some embodiments the removal may include two or more etching operation, firstly partially remove at least a portion of the SiGe stack 2, and subsequently remove the entire SiGe stack 2) while alleviating material loss to the Si layer under etching operation, a SiGe stack 2 is utilized. In order to control the etching rate at an exposed surface of the SiGe stack 2 and a position proximal to an interface between the SiGe stack 2 and the silicon layer 1, the SiGe stack 2 has the first silicon germanium layer 2LA as well as the third silicon germanium layer 2LB in direct contact with silicon layers 1, instead of having the silicon layer 1 being in direct contact with the second silicon germanium layer 2H having a higher germanium concentration. Thereby an etching rate at a position proximal to the interface between the silicon layer 1 and the SiGe stack 2 is relatively lower than an etching rate at a position at an exposed surface of the second silicon germanium layer 2H.

Furthermore, in order to support the structures of the silicon layers 1 after removing the remaining SiGe stack 2, the spacer 71 is formed between the silicon layers 1. Since the spacer 71 conforms to a profile of the lateral recess 6LR as discussed in FIG. 11A and FIG. 11B, it can be observed that the spacer 71 as a unique profile that reflects the distribution of etching rate of the exposed surface of the SiGe stack 2 as well as a position proximal to an interface between the SiGe stack 2 and the silicon layer 1.

Some embodiments of the present disclosure provide a semiconductor structure, including a substrate having a front surface, a fin protruding from the front surface, the fin including: a first semiconductor layer in proximal to the front surface, a second semiconductor layer stacked over the first semiconductor layer, a gate between the first semiconductor layer and the second semiconductor layer, and a spacer between the first semiconductor layer and the second semiconductor layer, contacting the gate, and a source/drain (S/D) region laterally surrounding the fin, wherein the spacer has an upper surface interfacing with the second semiconductor layer, the upper surface including: a first section proximal to the S/D region, a second section proximal to the gate, and a third section between the first section and the second section, wherein an absolute value of a derivative at the third section is greater than an absolute value of a derivative at the second section.

Some embodiments of the present disclosure provide a semiconductor structure, including a substrate having a front surface, a fin protruding from the front surface, the fin including: a first semiconductor layer in proximal to the front surface, a second semiconductor layer stacked over the first semiconductor layer, and a gate between the first semiconductor layer and the second semiconductor layer, and an source/drain (S/D) region laterally surrounding the fin, wherein a lower surface of the second semiconductor layer includes: a first section proximal to the S/D region, a second section proximal to the gate, and a third section between the first section and the second section, wherein an absolute value of a derivative at the third section is in a range of from about 0.3 to about 2.

Some embodiments of the present disclosure provide a method for fabricating a semiconductor structure, including forming a first silicon layer over a substrate, forming a first silicon germanium layer over the first silicon layer, wherein the first silicon germanium layer has a first germanium concentration, forming a second silicon germanium layer over the first silicon germanium layer, wherein the second silicon germanium layer has a second germanium concentration greater than the first germanium concentration, forming a third silicon germanium layer over the second silicon germanium layer, wherein the third silicon germanium layer has a third germanium concentration less than the second germanium concentration, forming a second silicon layer over the third silicon germanium layer, and partially removing the first silicon germanium layer, the second silicon germanium layer and the third silicon germanium layer from a lateral side by an etching operation.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor structure, comprising:

forming a first silicon layer over a substrate;

forming a first silicon germanium layer over the first silicon layer, wherein the first silicon germanium layer has a first germanium concentration;

forming a second silicon germanium layer over the first silicon germanium layer, wherein the second silicon germanium layer has a second germanium concentration greater than the first germanium concentration;

forming a third silicon germanium layer over the second silicon germanium layer, wherein the third silicon germanium layer has a third germanium concentration less than the second germanium concentration;

forming a second silicon layer over the third silicon germanium layer; and partially removing the first silicon layer, the first silicon germanium layer, the second silicon germanium layer and the third silicon germanium layer from a lateral side by an etching operation and thereby forming a recess laterally encroaching the first silicon layer, wherein a contour of the recess has a first section proximal to the lateral side, a second section connecting to the first silicon germanium layer, and a third section between the first section and the second section, and wherein an absolute value of a derivative at the third section is greater than both an absolute value of a derivative at the first section and an absolute value of a derivative at the second section.

2. The method of claim 1, wherein a thickness of the second silicon germanium layer is greater than either a thickness of the first silicon germanium layer or a thickness of the third silicon germanium layer.

3. The method of claim 1, wherein a lower surface of the second silicon layer and an upper surface of the first silicon layer are exposed after the etching operation.

4. The method of claim 1, further comprising forming a spacer over a sidewall of first silicon layer, a sidewall of the second silicon layer, a sidewall of the first silicon germanium layer, a sidewall of the second silicon germanium layer, and a sidewall of the third silicon germanium layer.

5. The method of claim 4, further comprising removing a portion of the spacer to expose the sidewall of the first silicon layer and the sidewall of the second silicon layer.

6. The method of claim 5, further comprising removing the first silicon germanium layer, the second silicon germanium layer and the third silicon germanium layer subsequent to removing the portion of the spacer.

7. The method of claim 1, wherein the etching operation imposes a greater etching rate to the second silicon germanium layer than to one of the first silicon germanium layer and the third silicon germanium layer.

8. A method for fabricating a semiconductor structure, comprising:

forming a first semiconductor layer, over a portion of a substrate;

forming a second semiconductor layer, over the first semiconductor layer, wherein the second semiconductor layer has a high germanium concentration at a middle portion of the second semiconductor layer, and low germanium concentrations at a lower portion and an upper portion of the second semiconductor layer;

laterally removing the first semiconductor layer and the second semiconductor layer by an etching operation;

forming a spacer at lateral sides of the first semiconductor layer and the second semiconductor layer after the etching operation, wherein an interface between the spacer and the first semiconductor layer has a first section proximal to the lateral side, a second section connecting to the lower portion of the second semiconductor layer, and a third section between the first section and the second section, and wherein an absolute value of a derivative at the third section is greater than both an absolute value of a derivative at the first section and an absolute value of a derivative at or the second section;

removing the second semiconductor layer; and forming a gate structure surrounding the first semiconductor layer.

9. The method of claim 8, wherein the first semiconductor layer has a germanium concentration lower than the germanium concentrations of the upper portion and the lower portion of the second semiconductor layer.

10. The method of claim 8, wherein the etching operation has a removal rate increasing as a germanium concentration increasing.

11. The method of claim 8, wherein the third section is separated from the gate structure.

12. The method of claim 8, further comprising:

forming a source/drain region laterally adjacent to the spacer.

13. The method of claim 8, wherein the formation of the spacer comprises:

forming a dielectric layer covering the first semiconductor layer and the second semiconductor layer; and removing portions of the dielectric layer on outer sidewall of the first semiconductor layer, wherein an outer sidewall of the spacer is recessed from the other sidewall of the first semi conductor layer.

14. The method of claim 8, wherein the formation of the gate structure comprises:

forming a high-k layer, surrounding the first semiconductor layer; and forming a gate material layer surrounded by the high-k layer.

15. The method of claim 8, wherein the gate material layer is separated from the spacer.

16. A method for fabricating a semiconductor structure, comprising:

forming a stack structure over a substrate, wherein the stack structure includes a plurality of silicon layers and a plurality of silicon germanium layers alternately arranged with the plurality of silicon layers, each of the silicon germanium layers has a high germanium concentration at a middle portion of the silicon germanium layer, and low germanium concentrations at a lower portion and an upper portion of the silicon germanium layer;

performing an etching operation on lateral sides of the silicon layers and the silicon germanium layers, wherein etching rates at a position of the middle portions of the silicon germanium layer is greater than etching rates at positions proximal to interfaces between the silicon layers and the silicon germanium layers thereby forming a recess laterally encroaching one of the plurality of the silicon layers, wherein a contour of the recess has a first section proximal to the lateral side of the one of the plurality of the silicon layers, a second section connecting to one of the upper portion or the lower portion of the silicon germanium layer, and a third section between the first section and the second section, and wherein an absolute value of a derivative at the third section is greater than both an absolute value of a derivative at the first section and an absolute value of a derivative at the second section;

forming a spacer structure laterally surrounding the silicon germanium layers and vertically between adjacent silicon layers;

forming a source/drain structure on lateral sides of the stack structure;

removing the silicon germanium layers; and forming a gate structure surrounding the first semiconductor layer.

17. The method of claim 16, wherein an interface between the spacer structure and one of the silicon layers has a step configuration.

18. The method of claim 16, further comprising:

forming a dummy gate structure over the stack structure; and removing the dummy gate structure prior to the formation of the gate structure.

19. The method of claim 16, wherein the source/drain structure contacts portions of bottom surfaces of the silicon layers.

20. The method of claim 16, wherein portions of the silicon layers proximal to the silicon germanium layers are removed concurrently with the removal of the silicon germanium layers.

* * * * *